(12) United States Patent
Kim et al.

(10) Patent No.: US 12,364,208 B2
(45) Date of Patent: Jul. 22, 2025

(54) LIGHT SOURCE FOR PLANT CULTIVATION

(71) Applicant: SEOUL VIOSYS CO., LTD., Gyeonggi-do (KR)

(72) Inventors: Se Ryung Kim, Gyeonggi-do (KR); Sang Min Ko, Gyeonggi-do (KR); Jin Won Kim, Gyeonggi-do (KR); Hyun Su Song, Gyeonggi-do (KR)

(73) Assignee: Seoul Viosys Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/615,653

(22) Filed: Mar. 25, 2024

(65) Prior Publication Data

US 2024/0224882 A1 Jul. 11, 2024

Related U.S. Application Data

(63) Continuation of application No. 18/482,459, filed on Oct. 6, 2023, now Pat. No. 11,968,937, which is a
(Continued)

(51) Int. Cl.
*A01G 7/04* (2006.01)
*A01G 9/20* (2006.01)
(Continued)

(52) U.S. Cl.
CPC .............. *A01G 7/045* (2013.01); *A01G 9/20* (2013.01); *F21V 23/003* (2013.01);
(Continued)

(58) Field of Classification Search
CPC .......... A01G 7/045; A01G 9/20; F21V 23/003
See application file for complete search history.

(56) References Cited

U.S. PATENT DOCUMENTS

| 8,373,363 B2 | 2/2013 | Grajcar |
| 8,531,136 B2 | 9/2013 | Grajcar |

(Continued)

FOREIGN PATENT DOCUMENTS

| JP | 2003339236 A | 12/2003 |
| JP | 2007075073 | 3/2007 |

(Continued)

OTHER PUBLICATIONS

International Search Report for International Application No. PCT/KR2019/010772, Nov. 29, 2019, 3 pages.
(Continued)

*Primary Examiner* — Mary Ellen Bowman
(74) *Attorney, Agent, or Firm* — LaBatt, LLC

(57) ABSTRACT

A light source can include at least one light emitter and is configured to emit a first light during a region of a light period and emit both the first light and a second light of a different wavelength during a remaining region of the light period. The emitter can include semiconductor layers and an active layer configured to emit light having a specific wavelength due to a band gap difference in an energy band depending on a material used to form the active layer. A plant cultivation device can include the light source and a main body in which a plant can be grown. The light period can be configured to increase a content of an active ingredient in the plant. The first light can have a longer peak wavelength than a peak wavelength of the second light.

20 Claims, 15 Drawing Sheets

Related U.S. Application Data continuation of application No. 17/694,046, filed on Mar. 14, 2022, now Pat. No. 11,778,953, which is a continuation of application No. 16/548,350, filed on Aug. 22, 2019, now Pat. No. 11,291,164.

(60) Provisional application No. 62/722,405, filed on Aug. 24, 2018.

(51) Int. Cl.
    *F21V 23/00*     (2015.01)
    *F21Y 113/00*    (2016.01)
    *F21Y 113/13*    (2016.01)
    *F21Y 115/10*    (2016.01)

(52) U.S. Cl.
     CPC ........ *F21Y 2113/13* (2016.08); *F21Y 2113/30* (2023.05); *F21Y 2115/10* (2016.08)

(56) References Cited

U.S. PATENT DOCUMENTS

| | | |
|---|---|---|
| 8,596,804 B2 | 12/2013 | Grajcar |
| 8,643,308 B2 | 2/2014 | Grajcar |
| 8,651,691 B2 | 2/2014 | Grajcar |
| 10,820,532 B2 | 11/2020 | Kim et al. |
| 11,125,405 B2 | 9/2021 | Song et al. |
| 11,291,164 B2 | 4/2022 | Kim et al. |
| 11,432,473 B2 | 9/2022 | Kim et al. |
| 11,778,953 B2 | 10/2023 | Kim et al. |
| 11,968,937 B2 | 4/2024 | Kim et al. |
| 2005/0135104 A1 | 6/2005 | Crabb et al. |
| 2007/0058368 A1 | 3/2007 | Partee et al. |
| 2008/0298052 A1 | 12/2008 | Hurst et al. |
| 2008/0302004 A1 | 12/2008 | Lin |
| 2009/0303706 A1 | 12/2009 | Atehortua |
| 2010/0020536 A1 | 1/2010 | Bafetti et al. |
| 2010/0043287 A1 | 2/2010 | Jones et al. |
| 2011/0016785 A1 | 1/2011 | Yamada et al. |
| 2011/0101883 A1 | 5/2011 | Grajcar |
| 2011/0109244 A1 | 5/2011 | Grajcar |
| 2011/0163246 A1 | 7/2011 | Ishiwata et al. |
| 2011/0179706 A1 | 7/2011 | Hunt et al. |
| 2011/0209400 A1 | 9/2011 | Rooymans |
| 2011/0228515 A1 | 9/2011 | Grajcar |
| 2011/0273098 A1 | 11/2011 | Grajcar |
| 2012/0075848 A1 | 3/2012 | Yamada et al. |
| 2012/0124903 A1 | 5/2012 | Takeuchi |
| 2012/0268918 A1 | 10/2012 | Grajcar |
| 2013/0040380 A1 | 2/2013 | Hunt et al. |
| 2013/0301258 A1 | 11/2013 | Aoki |
| 2014/0069007 A1 | 3/2014 | Chen et al. |
| 2014/0152194 A1 | 6/2014 | Beyer |
| 2014/0165462 A1 | 6/2014 | Shigyo et al. |
| 2014/0250778 A1 | 9/2014 | Suntych |
| 2015/0128488 A1 | 5/2015 | Casper et al. |
| 2015/0128489 A1 | 5/2015 | Yamada et al. |
| 2015/0150195 A1 | 6/2015 | Grajcar |
| 2015/0173379 A1 | 6/2015 | Lee et al. |
| 2015/0216130 A1 | 8/2015 | Grajcar et al. |
| 2015/0223402 A1 | 8/2015 | Krijn et al. |
| 2015/0273235 A1 | 10/2015 | Grajcar |
| 2016/0014974 A1 | 1/2016 | Grajcar et al. |
| 2016/0113213 A1 | 4/2016 | Berinsky |
| 2016/0205739 A1 | 7/2016 | Grajcar |
| 2017/0311553 A1 | 11/2017 | Dobrinsky et al. |
| 2018/0007838 A1 | 1/2018 | McCord |
| 2018/0028700 A1 | 2/2018 | Dobrinsky et al. |
| 2018/0054974 A1 | 3/2018 | Vasilenko |
| 2018/0092308 A1 | 4/2018 | Barber, III et al. |
| 2019/0150378 A1 | 5/2019 | Oh et al. |
| 2020/0149060 A1 | 5/2020 | Wargent |
| 2020/0367442 A1 | 11/2020 | McClear |
| 2022/0003370 A1 | 1/2022 | Song et al. |

FOREIGN PATENT DOCUMENTS

| | | |
|---|---|---|
| JP | 2008167704 | 7/2008 |
| JP | 2009261311 | 11/2009 |
| JP | 2012205520 A | 10/2012 |
| JP | 2013123417 A | 6/2013 |
| JP | 2014233247 | 12/2014 |
| JP | 2015521046 A | 7/2015 |
| JP | 2015526104 | 9/2015 |
| JP | 2015204801 | 11/2015 |
| KR | 1020100135919 A | 12/2010 |
| KR | 1020150035817 A | 4/2015 |
| WO | 2011016521 | 2/2011 |
| WO | 2013021676 | 2/2013 |
| WO | 2017188719 A1 | 11/2017 |

OTHER PUBLICATIONS

International Search Report for International Application No. PCT/KR2019/010771, Nov. 29, 2019, 5 pages.
Office Action for U.S. Appl. No. 16/536,222, filed Dec. 3, 2020, 12 pages.
Notice of Allowance for U.S. Appl. No. 16/536,222, filed May 21, 2021, 12 pages.
Office Action for U.S. Appl. No. 16/548,337, filed Jan. 31, 2020, 16 pages.
Final Office Action for U.S. Appl. No. 16/548,337, filed Apr. 23, 2020, 17 pages.
Notice of Allowance for U.S. Appl. No. 16/548,337, filed Jul. 17, 2020, 10 pages.
Extended European Search Report for European Application No. 19851004.2, Feb. 2, 2022, 11 pages.
Office Action for U.S. Appl. No. 16/548,350, filed Jul. 6, 2021, 10 pages.
Final Office Action for U.S. Appl. No. 16/548,350, filed Nov. 10, 2021, 8 pages.
Notice of Allowance for U.S. Appl. No. 16/548,350, filed Feb. 8, 2022, 8 pages.
Notice of Allowance for U.S. Appl. No. 17/022,531, filed Aug. 3, 2022, 9 pages.
Notice of Allowance for U.S. Appl. No. 17/694,046, filed Jun. 1, 2023, 8 pages.
Notice of Allowance for U.S. Appl. No. 17/694,046, filed Jul. 19, 2023, 7 pages.
Office action for Japanese Patent Application No. 2021-509838 with English translation, Mar. 7, 2023, 10 pages.
Notice of allowance for U.S. Appl. No. 17/897,925, filed Feb. 6, 2023, 9 pages.
Office action for Japanese Patent Application No. 2021-510160 with English translation, Jun. 20, 2023, 6 pages.
Office Action for Japanese Patent Application No. 2021-509838 with English translation, mailed Aug. 22, 2023, 6 pages.
Notice of Allowance for U.S. Appl. No. 17/694,046, filed Sep. 1, 2023, 2 pages.
Notice of allowance for U.S. Appl. No. 18/141,500, filed Oct. 26, 2023, 9 pages.
Notice of allowance for U.S. Appl. No. 18/482,459, filed Mar. 20, 2024, 7 pages.
Office Action for Korean Application No. 10-2021-7005308 (no English translation available), Sep. 30, 2024, 8 pages.
Office Action for U.S. Appl. No. 18/649,405, filed Nov. 6, 2024. 13 pages.
Office action for European Patent Application No. 19851004.2, Mar. 27, 2025, 11 pages.
Office action for Japanese Patent Application No. 2024-004974, Feb. 18, 2025, 3 pages (no English translation available).
Notice of allowance for U.S. Appl. No. 18/649,405, filed Apr. 14, 2025, 8 pages.

FIG. 3A

| | Start point | Lapse of time (day) | | | |
|---|---|---|---|---|---|
| Comparative example | Sowing | Dark period | Irradiation period before transplanting | Irradiation period after transplanting | Harvest |
| Experimental example 1 | Sowing | Dark period | Irradiation period before transplanting | Irradiation period after transplanting (light treatment on 30th day) | Harvest |
| Experimental example 2 | Sowing | Dark period | Irradiation period before transplanting | Irradiation period after transplanting (light treatment from 24th day) | Harvest |

FIG. 3B

| | Feature | Lapse of time (hour) | |
|---|---|---|---|
| Light condition | | Dark period | Light period |
| Comparative example | - | - | First period |
| Experimental example 1 | Continuously | - | Second period / First period |
| Experimental example 2 | Alternately | - | 2nd per. / 1st per. / 2nd per. / 1st per. / 2nd per. / 1st per. ... 2nd per. / 1st per. / 2nd per. / 1st per. / 2nd per. / 1st per. |

FIG. 8A

| | Start point | Lapse of time (day) | | | |
|---|---|---|---|---|---|
| Comparative example | Sowing | Dark period | Irradiation period before transplanting | Irradiation period after transplanting | Harvest |
| Experimental example 1 | Sowing | Dark period | Irradiation period before transplanting | Irradiation period after transplanting (light treatment on 27th day) | Harvest |
| Experimental example 2 | Sowing | Dark period | Irradiation period before transplanting | Irradiation period after transplanting (light treatment from 26th day) | Harvest |
| Experimental example 3 | Sowing | Dark period | Irradiation period before transplanting | Irradiation period after transplanting (light treatment from 24th day) | Harvest |

FIG. 8B

| | Total energy amount of second light | Lapse of time (hour) | |
|---|---|---|---|
| Light condition | | Dark period | Light period |
| Comparative example | - | - | First period |
| Experimental example 1 | 2.304 kJ/m² | - | (alternating periods) |
| Experimental example 2 | 2.980 kJ/m² | - | (alternating periods) |
| Experimental example 3 | 4.532 kJ/m² | - | (alternating periods) |

LIGHT SOURCE FOR PLANT CULTIVATION

CROSS-REFERENCE TO RELATED APPLICATION

The present application is a continuation of U.S. application Ser. No. 18/482,459, filed Oct. 6, 2023, which is a continuation of U.S. application Ser. No. 17/694,046, filed Mar. 14, 2022, which is a continuation of U.S. application Ser. No. 16/548,350, filed Aug. 22, 2019, which claims the benefit of U.S. Provisional Application No. 62/722,405, filed on Aug. 24, 2018, each of which is hereby incorporated by reference for all purposes as if fully set forth herein.

BACKGROUND

1. Field of Disclosure

The present disclosure relates to a light source for plant cultivation. More particularly, the present disclosure relates to a light source that emits a light resulting in increasing a content of active ingredient in Asteraceae family plants.

2. Description of the Related Art

Various light sources, as an alternative to sunlight are under development and have been used as lightings for plant cultivation. Conventionally, incandescent lamps and fluorescent lamps are mainly used as the lighting sources for plant cultivation. However, the conventional lightings for plant cultivation provide light having a specific wavelength to plants for only the purpose of plant photosynthesis, and most of them may not have additional functions.

Plants synthesize substances useful to humans while resisting a variety of stress factors, and to this end, a light source and a cultivation device are required to cultivate plants that contain a large amount of substances useful to humans.

SUMMARY

According to one or more embodiments of the present disclosure, a plant cultivation light module includes a first light source, a second light source and a controller. The first light source includes a first light emitter configured to emit first light having peak wavelength in a visible range and a second light emitter configured to emit second light having a longer peak wavelength to the first light. The second light source includes a plurality of third light emitters configured to emit third light having a shorter peak wavelength to the first light. The controller is configured to control the first light emitter, the second light emitter and one or more of the plurality of third light emitters such that a first light pattern and a second light pattern are generated. The first light source and the second light source further include a first semiconductor layer, a second semiconductor layer, and an active layer. The active layer is disposed on the first semiconductor layer to emit a light having a specific wavelength due to a band gap difference in an energy band depending on a material used to form the active layer. The first light pattern provides a first light spectrum and the second light pattern provides a second light spectrum having at least one more peak wavelength than the first light spectrum. The first light source supplies, to the plant, light of the first light pattern and the second light source supplies, to the plant, light of the second pattern.

In at least one variant, the first light source comprises a plurality of first light emitters and a plurality of second light emitters, and a composition ratio of the plurality of first light emitters and the plurality of second light emitters differ.

In another variant, the second light emitter is further configured to emit light in an infrared wavelength band or near-infrared wavelength band.

In another variant, the plurality of third light emitters is further configured to emit light of an ultraviolet wavelength band.

In another variant, the controller controls the first light source and the second light source individually.

In another variant, the plurality of third light emitter is further configured to emit the third light having a sharp peak at a specific wavelength having a narrower FWHM than a UV lamp thereof.

In another variant, the controller controls operations of the first light source and second light source wirelessly.

In another variant, the plurality of third light emitters is configured to provide to the plant the third light correlated to increase a content of an active ingredient in the plant. The active ingredient comprises at least one of chlorophylls, flavonoids, anthocyanins, chlorogenic acids, sesquiterpene lactones, and phenolic compounds.

In another variant, the first light source comprises a plurality of first light emitters and a plurality of second light emitters. A composition ratio of the plurality of first light emitters and the plurality of second light emitters is identical and the plurality of first light emitters and the plurality of second light emitters are driven at different ratios depending on a type of the plant.

According to one or more embodiments of the present disclosure, a plant cultivation device includes a main body housing a plant, a light source provided in the main body to irradiate a light to the plant, and a controller controlling the light source. The light source includes a first light source and a second light source. The first light source includes a first light emitter configured to emit first light having peak wavelength in a visible range and a second light emitter configured to emit second light having a longer peak wavelength to the first light emitter. The second light source includes a plurality of third light emitters configured to emit third light having a shorter peak wavelength to the first light emitter. The controller is configured to control the first light emitter, the second light emitter, and the plurality of third light emitters such that a first light pattern and a second light pattern are provided. The first light source and the second light source further include a first semiconductor layer, a second semiconductor layer, and an active layer. The active layer is disposed on the first semiconductor layer to emit a light having a specific wavelength due to a band gap difference in an energy band depending on a material used to form the active layer. The first light pattern provides a first spectrum and the second light pattern provides a second spectrum having at least one more peak wavelength than the first spectrum. The first light source supplies, to the plant, light of the first light pattern and the second light source supplies, to the plant, light of the second light pattern.

In at least one variant, the first light source comprises a plurality of the first light emitters and a plurality of second light emitters, and a composition ratio of the plurality of first light emitters and the plurality of second light emitters differ.

In another variant, the controller controls the first light source and the second light source individually.

In another variant, the controller controls operation of the first light source and second light source wirelessly.

In another variant, the plurality of third light emitters is further configured to provide to the plant the third light correlated to increase a content of an active ingredient in the plant, wherein the active ingredient comprises at least one of chlorophylls, flavonoids, anthocyanins, chlorogenic acids, sesquiterpene lactones, and phenolic compounds.

In another variant, the controller is further configured to control the first light emitter, the second light emitter, and the plurality of third light emitters such that the light of the first light pattern is customized to a type of seeds of the plant.

According to one or more embodiments of the present disclosure, a plant cultivation light module includes a first light source, a second light source, and a controller. The first light source includes a plurality of first light emitters configured to emit first light and a plurality of second light emitters configured to emit second light having a longer peak wavelength than the first light. The second light source includes a plurality of third light emitters configured to emit third light having a shorter peak wavelength to the first light. The controller is configured to control the plurality of first light emitters, the plurality of second light emitters, and the plurality of third light emitters such that a first light pattern and a second light pattern are provided. The first light source and the second light source further comprise a first semiconductor layer, a second semiconductor layer, and an active layer. The active layer is disposed on the first semiconductor layer to emit a light having a specific wavelength due to a band gap difference in an energy band depending on a material used to form the active layer. The first light pattern provides a first spectrum and the second light pattern provides a second spectrum having at least one more peak wavelength than the first spectrum. A composition ratio of the plurality of first light emitters and the plurality of second light emitters differ.

In at least one variant, the controller controls the first light source and the second light source individually.

In another variant, the controller controls operation of the first light source and second light source wirelessly.

In another variant, the plurality of third light emitters provides to the plant the third light correlated to increase a content of an active ingredient in the plant. The active ingredient comprises at least one of chlorophylls, flavonoids, anthocyanins, chlorogenic acids, sesquiterpene lactones, and phenolic compounds.

In another variant, the composition ratio is adjusted such that the first light pattern, the second light pattern or both are customized to a type of the plant.

The present disclosure provides a light source for emitting a light that increases a content of an active ingredient while retaining an inherent color of Asteraceae family plants.

Embodiments of the inventive concept provide a plant cultivation light source being turned on or turned off depending on a light period and a dark period of a plant. The plant cultivation light source includes a first semiconductor layer, a second semiconductor layer, and an active layer, and the active layer is disposed on the first semiconductor layer to emit a light having a specific wavelength due to a band gap difference in an energy band depending on a material used to form the active layer. When a portion of the light period is referred to as a first period and the other portion of the light period is referred to as a second period, the first period and the second period are alternately provided with each other, and lights having different wavelengths from each other are provided to the plant in the first and second periods, thereby increasing a content of an active ingredient in the plant.

The cultivation light source includes a first light source emitting a first light and a second light source emitting a second light, and one of the first and second light sources is turned on in at least one period of the first and second periods.

The second light is provided to the plant in an on and off manner.

The first light is a light of a visible light wavelength band, the second light is a light of an ultraviolet light wavelength band, the first light is provided to the plant in the first period, and the second light is provided to the plant in the second period.

The second light is an ultraviolet B wavelength band.

The second light has a wavelength band from about 280 nm to about 315 nm.

A total cumulative energy amount of the second light irradiated to the plant is equal to or smaller than about 2.304 kJ/m$^2$.

The first period and the second period are alternately repeated in the light period, and the first period and the second period, which are adjacent to each other, form one repetition period.

A light provided in the second period of the repetition period is not provided in the first period.

The second period is provided in the light period from a predetermined number of days prior to harvest until the harvest.

The active ingredient includes at least one of chlorophylls, flavonoids, anthocyanins, chlorogenic acids, sesquiterpene lactones, and phenolic compounds.

Embodiments of the inventive concept provide a plant cultivation device employing the plant cultivation light source. The plant cultivation device includes a main body in which a plant is provided, a light source provided in the main body to irradiate a light to the plant, and a controller controlling the light source. The light source is turned on or turned off depending on a light period and a dark period of the plant. When a portion of the light period is referred to as a first period and the other portion of the light period is referred to as a second period, the first period and the second period are alternately provided with each other, and lights having different wavelengths from each other are provided to the plant in the first and second periods, thereby increasing a content of an active ingredient in the plant.

According to the above, the light source for emitting the light that increases the content of the active ingredient while retaining the inherent color of the plant of Asteraceae family plant may be provided.

BRIEF DESCRIPTION OF THE DRAWINGS

The above and other advantages of the present disclosure will become readily apparent by reference to the following detailed description when considered in conjunction with the accompanying drawings wherein:

FIG. 3A is a view showing growth conditions of the Cichorioideae subfamily plants according to a comparative example and experimental examples;

FIG. 3B is a view showing another growth conditions of the Cichorioideae subfamily plants according to a comparative example and experimental examples;

FIG. 5A illustrates that the active ingredient corresponds to chlorogenic acids;

FIG. 5B illustrates that the active ingredient corresponds to chlorophylls;

FIG. 5C illustrates that the active ingredient corresponds to flavonoids; and

FIG. 5D illustrates that the active ingredient corresponds to anthocyanins;

FIG. 6A illustrates the active ingredient measured with respect to chlorophylls;

FIG. 6B illustrates the active ingredient measured with respect to flavonols; and FIG. 6C illustrates the active ingredient measured with respect to anthocyanins;

FIG. 7A illustrates a photograph of chicory among the Cichorioideae subfamily plants;

FIG. 7B illustrates a photograph of red lollo rosso red leaf lettuce among the Cichorioideae subfamily plants;

FIG. 7C illustrates a photograph of red leaf lettuce (Jeokchukmyeon) among the Cichorioideae subfamily plants;

FIG. 7D illustrates a photograph of red leaf lettuce (Jeokchima) among the Cichorioideae subfamily plants;

FIG. 7E illustrates a photograph of romaine lettuce among the Cichorioideae subfamily plants; and FIG. 7F illustrates a photograph of green leaf lettuce (Cheongchima) among the Cichorioideae subfamily plants;

FIGS. 8A and 8B are views showing growth conditions of a red leaf lettuce (Jeokchima), where:

FIG. 8A illustrates exemplary growth conditions of the red leaf lettuce (Jeokchima); and FIG. 8B illustrates another exemplary growth conditions of the red leaf lettuce (Jeokchima);

FIG. 9A illustrates a graph showing chlorophylls contained in the red leaf lettuce (Jeokchima) after harvest in Comparative example and Experimental examples 1 to 3;

FIG. 9B illustrates a graph showing flavonoids contained in the red leaf lettuce (Jeokchima) after harvest in Comparative example and Experimental examples 1 to 3;

FIG. 9C illustrates a graph showing anthocyanins contained in the red leaf lettuce (Jeokchima) after harvest in Comparative example and Experimental examples 1 to 3; and FIG. 9D illustrates a bio weight at harvest and a dry weight of the red leaf lettuce (Jeokchima).

DETAILED DESCRIPTION OF EMBODIMENTS

Figure 1A:
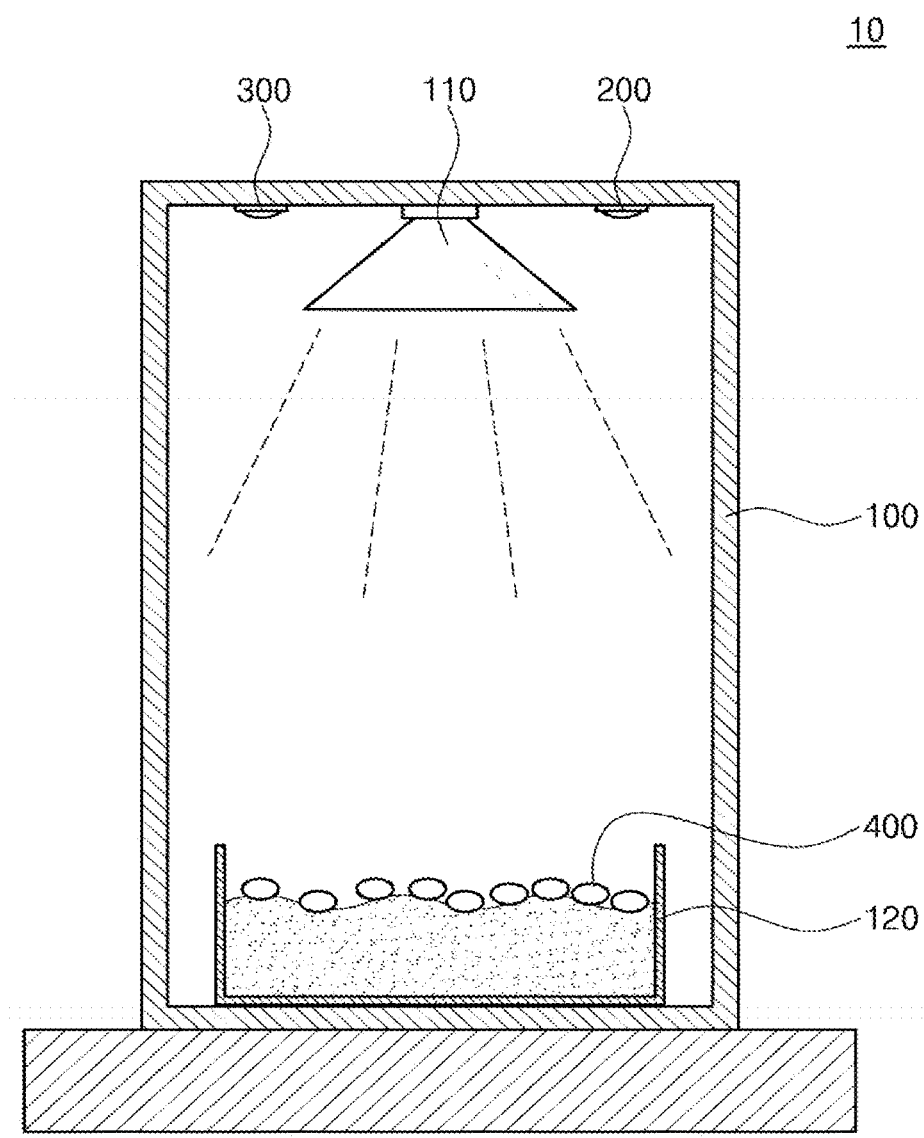
FIG. 1A is a cross-sectional view showing a Cichorioideae subfamily plant cultivation device according to an exemplary embodiment of the present disclosure.

The present disclosure may be variously modified and realized in many different forms, and thus specific embodiments will be exemplified in the drawings and described in detail hereinbelow. However, the present disclosure should not be limited to the specific disclosed forms, and be construed to include all modifications, equivalents, or replacements included in the spirit and scope of the present disclosure.

Like numerals refer to like elements throughout. In the drawings, the thickness, ratio, and dimension of components are exaggerated for effective description of the technical content. It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure. As used herein, the singular forms, "a", "an" and "the" are intended to include the plural forms as well, unless the context clearly indicates otherwise.

It will be further understood that the terms "comprises" and/or "comprising", or "includes" and/or "including", when used in this specification, specify the presence of stated features, integers, steps, operations, elements, and/or components, but do not preclude the presence or addition of one or more other features, integers, steps, operations, elements, components, and/or groups thereof.

The present disclosure relates to a light source used to cultivate plants and a cultivation device including such a light source.

Plants photosynthesize using a light in a visible light wavelength band and gain energy through photosynthesis. The photosynthesis of plants does not occur to the same extent in all wavelength bands. The light in a specific wavelength band that plants use for photosynthesis in sunlight is called Photosynthetic Active Radiation (PAR), occupies a portion of solar spectrum, and corresponds to a band from about 400 nanometers to about 700 nanometers. The light source for plant cultivation according to an exemplary embodiment of the present disclosure includes the light in the PAR wavelength band to provide an appropriate light for plant photosynthesis and provides a light in a wavelength band to increase the content of ingredients (hereinafter, referred to as "active ingredients") that positively affect the health of humans or the plants upon ingestion. In this case, the active ingredients are substances known to be necessary for humans, such as chlorophylls, flavonols, anthocyanins, sesquiterpene lactones, and phenolic compounds.

The light source according to an exemplary embodiment of the present disclosure may apply to various types of plants. However, there may be differences in the photosynthetic efficiency of the light emitted from the light source or the degree of increase in the content of the active ingredients depending on the types of plants. The light source according to an exemplary embodiment of the present disclosure may be applied to Asteraceae family plants. In addition, the light source according to an exemplary embodiment of the present disclosure may be applied to a Cichorioideae subfamily plant, which belongs to the Asteraceae family plants. The types of plants according to an exemplary embodiment of the present disclosure should not be limited thereto, and the light source may be applied to other types of plants. In the exemplary embodiment of the present disclosure, the plants to which the light source is applied include edible Asteraceae family plants, and in particular, the Cichorioideae subfamily plant. The Cichorioideae subfamily plant may be at least one of a red leaf lettuce (Jeokchima), a red leaf lettuce (Jeokchukmyeon), a green leaf lettuce (Cheongchima), a red lollo rosso red leaf lettuce, a butterhead lettuce, a romaine lettuce, a chicory, a dandelion chicory, and a red chicory.

Hereinafter, for the convenience of explanation, the light source applied to the Cichorioideae subfamily plant will be described as a representative example.

FIG. 1A is a cross-sectional view showing a plant cultivation device 10 according to an exemplary embodiment of the present disclosure.

Referring to FIG. 1A, the plant cultivation device 10 according to the present disclosure includes a main body 100 and a light source. The light source includes a first light source 200 and a second light source 300.

The main body 100 may include an empty space in which seeds 400 of the Cichorioideae subfamily are provided and may be provided in a box shape that is capable of blocking an external light. In the exemplary embodiment of the present disclosure, the seeds of the Cichorioideae subfamily may mean seeds of at least one of a red leaf lettuce (Jeokchima), a red leaf lettuce (Jeokchukmyeon), a green leaf lettuce (Cheongchima), a red lollo rosso red leaf lettuce, a butterhead lettuce, a romaine lettuce, a chicory, a dandelion chicory, and a red chicory.

The main body 100 provides an environment in which the seeds 400 provided therein may be grown. The main body 100 may have a size such that a plurality of seeds 400 may be provided and grown. In addition, the size of the main body 100 may be altered depending on the use of the plant cultivation device 10. For example, in a case where the plant cultivation device 10 is used for a small-scale plant cultivation such as in-home use, the size of the main body 100 may be relatively small. In a case where the plant cultivation device 10 is used for commercial plant cultivation, the size of the main body 100 may be relatively large.

In the exemplary embodiment of the present disclosure, the main body 100 may block external light such that the external light is not incident into the main body 100. A dark room environment, which is isolated from the outside, may be provided inside the main body 100. Therefore, the external light may be prevented from being irradiated to the seeds 400 arranged in the main body 100. In particular, the main body 100 may prevent an external visible light from being irradiated to the seeds 400. However, the main body 100 may be designed to be partially open to receive the external light depending on circumstances.

In the exemplary embodiment of the present disclosure, a photocatalyst may be coated on an inner surface of the main body 100. The photocatalyst receives the light provided from the first light source 200 and activates a photocatalytic reaction. Accordingly, although the dark room environment with a lot of moisture is maintained in the main body 100, it is possible to prevent bacteria or fungi from growing inside the main body 100. A photocatalytic material for performing this function may be at least one selected from titanium dioxide ($TiO_2$), zirconia ($ZrO_2$), tungsten oxide ($WO_3$), zinc oxide ($ZnO$), and tin oxide ($SnO_2$).

The main body 100 may include a culture platform 120 in which the Cichorioideae subfamily plant is cultivated.

The seeds 400 of the Cichorioideae subfamily are provided on the culture platform 120. The culture platform 120 may support the seeds 400, and substantially simultaneously, may provide nutrients to grow the seeds 400. Thus, the culture platform 120 may include a culture medium required to grow the seeds 400, and the culture medium may include a soil containing inorganic substances, such as potassium (K), calcium (Ca), magnesium (Mg), sodium (Na), and iron (Fe).

The culture platform 120 may be provided in a structure including the culture medium and a container accommodating the culture medium. The container may have a box shape in which at least one surface, e.g., an upper surface, is removed. The culture medium and the seeds 400 may be provided inside the container having the box shape. The seeds 400 may be provided while being imbedded in the culture medium or placed on a surface of the culture medium depending on its type.

The culture platform 120 may have a size and a shape, which may be modified depending on the shape of the main body 100 and how to accommodate the first light source 200 and the second light source 300. The size and the shape of the culture platform 120 may be configured to allow the seeds 400 provided on the culture platform 120 to be placed within an irradiation range of the light from the first light source 200 and the second light source 300.

A water supply unit 110 is provided in the main body 100 to supply water to the seeds. The water supply unit 110 may be configured to be disposed at an upper end of the main body 110 and to spray water onto the culture platform 120 disposed at a lower end of the main body 110. However, the configuration of the water supply unit 110 should not be limited thereto or thereby, and various types of water supply units 110 may be provided depending on the shape of the main body 100 and the arrangement of the culture platform 120.

The water supply unit 110 may be provided in a singular or plural number. The number of the water supply units 110 may be altered depending on the size of the main body 110. For instance, in the case of the relatively small-sized plant cultivation device 10 for the home usage, one water supply unit 110 may be used since the size of the main body 100 is small. In the case of the relatively large-sized commercial plant cultivation device 10, the plural water supply units 110 may be used since the size of the main body 100 is large. However, the number of the water supply units should not be limited thereto or thereby, and the water supply unit may be provided in a variety of positions in various numbers.

The water supply unit 110 may be connected to a water tank provided in the main body 100 or a faucet outside the main body 100. In addition, the water supply unit 110 may further include a filtration unit such that contaminants floating in the water are not provided to the seeds 400. The filtration unit may include a filter, such as an activated carbon filter or a non-woven fabric filter, and thus the water passing through the filtration unit may be purified. The filtration unit may further include a light irradiation filter. The light irradiation filter may remove germs, bacteria, fungal spores, and the like, which are present in water, by irradiating an ultraviolet light or the like to water. As the water supply unit 110 includes the above-mentioned filtration unit, the inside of the main body 100 and the seeds 400 may be less likely contaminated even when water is recycled or rainwater or the like is directly used for the cultivation.

The water provided from the water supply unit 110 may be provided as plain water itself (for example, purified water) without additional nutrients, however, it should not be limited thereto or thereby. The water provided from the water supply unit 110 may contain nutrients necessary for the growth of the plants of the Cichorioideae subfamily. For example, the water may contain a material, such as potassium (K), calcium (Ca), magnesium (Mg), sodium (N), and iron (Fe), and a material, such as nitrate, phosphate, sulfate, and chloride (Cl). For instance, Sachs's solution, Knop's solution, Hoagland's solution, or Hewitt's solution may be supplied from the water supply unit 110.

The first light source 200 irradiates the light in a first wavelength band to the seeds 400. The seeds 400 may grow by being irradiated with the light in the first wavelength band.

The first wavelength band emitted from the first light source 200 may be a visible light wavelength band. Therefore, the seeds 400 may receive the light in the first wavelength band, which is emitted from the first light source 200, and may perform photosynthesis. The plants may grow from the seeds 400 by the photosynthesis.

As described above, the first light source 200 may include one or more light emitting diodes to emit the light in the visible light wavelength band.

The above-mentioned at least one light emitting diode may be a light emitting diode that emits a white light or may be a light emitting diode that emits a color light in various visible lights. For example, when the first light source 200 includes plural light emitting diodes, the light emitting diodes may emit lights having different wavelength bands, respectively. In the exemplary embodiment of the present disclosure, the first light source 200 may emit a light in an infrared or near-infrared wavelength band according to circumstances.

In the exemplary embodiment of the present disclosure, when the first light source 200 includes plural light emitting diodes, the light emitting diodes may include, for example, a light emitting diode that emits a red light, a light emitting diode that emits a blue light, and a light emitting diode that emits a green light, and thus a white light may be implemented. Alternatively, the first light source 200 may include the light emitting diode that emits the red light and the light emitting diode that emits the blue light without including the light emitting diode that emits the green light.

In the exemplary embodiment of the present disclosure, the plants of the Cichorioideae subfamily may receive the red light and the blue light emitted from the above-mentioned light emitting diodes and may actively perform photosynthesis. In this case, the red light may promote the photosynthesis of the plants to accelerate the growth of the plants from the seeds 400, and the blue light may contribute to formation of plant leaf from the seeds 400 and may induce flowering of the plants. The first light source 200 may include the light emitting diode that emits the green light. The light emitting diode emitting the green light may increase a photosynthetic efficiency of the plants.

In the exemplary embodiment of the present disclosure, when the first light source 200 includes the light emitting diodes that emit the lights having different wavelengths as described above, a composition ratio of the light emitting diodes may differ depending on the wavelength. For example, the light emitting diodes that emit the red light and the blue light may be provided less than the light emitting diode that emits the green light. A ratio between the light emitting diodes that emit the red light, the blue light, and the green light may be determined according to the type of the seeds 400. For instance, the composition ratio may be altered depending on a ratio of cryptochrome that is a blue light receptor to phytochrome that is a red light receptor. Alternatively, the light emitting diodes emitting the lights of respective wavelength bands may be provided in the same numbers, and in this case, the light emitting diodes may be driven at different ratios depending on the type of plant.

Since the light emitting diodes provided in the first light source 200 have a waveform having a high peak at a specific wavelength, it is possible to irradiate the lights customized to the type of the seeds 400. Therefore, the plants may grow faster and bigger with less power. In an exemplary embodiment of the present disclosure, the light emitting diodes of the first light source 200 may include the red light emitting diode, a white light emitting diode, and the blue light emitting diode. For example, the first light source 200 may include the red light emitting diode, the white light emitting diode, and the blue light emitting diode in a ratio of 12:10:32.

The first light source 200 is disposed at a position suitable to provide the light to the seeds 400. For example, the first light source 200 may be provided on an inner wall of an upper portion or a sidewall portion inside the main body 100. In FIG. 1A, the first light source 200 disposed on the upper portion of the main body 100 is shown, and the first light source 200 irradiates the light to the seeds 400 provided on a lower portion of the main body 100. The position of the first light source 200 may be determined by considering an irradiation angle of the light from the first light source 200 and a position of the culture platform 120 in which the seeds 400 are provided.

In the exemplary embodiment of the present disclosure, the first light source 200 may have a waterproof structure. Accordingly, even though water splashes on the first light source 200, the first light source 200 may be prevented from having water damage.

The second light source 300 emits light in a second wavelength band to the seeds 400.

The second wavelength band is different from the first wavelength band and is the ultraviolet wavelength band in a range from about 250 nm to about 380 nm. In the exemplary embodiment of the present disclosure, the second wavelength band may correspond to at least one wavelength band among lights having wavelength bands of a UV-A, a UV-B, and a UV-C. In the exemplary embodiment of the present disclosure, the second light source 300 may emit a light having a wavelength band from about 280 nm to about 315 nm. As another way, the second light source 300 may emit a light having a wavelength band of about 285 nm. To this end, the second light source 300 may include at least one light emitting diode that emits the light having the above-mentioned wavelength band. Each of the second light source 300 or the light emitting diode included in the second light source 300 may be provided in a plural number. In this case, the light emitting diodes may emit lights having different wavelengths from each other. For example, the second light source 300 may be configured to allow a portion of the second light sources 300 or the light emitting diodes to emit the light having the wavelength of about 285 nm and the other portion of the second light sources 300 or the light emitting diodes to emit the light having the wavelength of about 295 nm.

The second light source 300 is to alter a content of active ingredients of the seeds 400 and the plants grown from the seeds 400 by irradiating the light in the ultraviolet wavelength band to the plants of the Cichorioideae subfamily. The content of active ingredients in the seeds 400 and the plants of the Cichorioideae subfamily may be altered by irradiating the light emitted from the second light source 300 to the plants of the Cichorioideae subfamily for a predetermined time at a predetermined intensity without affecting the growth of the seeds 400.

The second light source 300 may have a waterproof structure. Accordingly, even though the water splashes on the second light source 300, the second light source 300 may be prevented from malfunctioning.

In the exemplary embodiment of the present disclosure, a controller (not shown) for controlling whether to operate or not the first light source 200 and the second light source 300 may be connected to the first light source 200 and/or the second light source 300 by wire or wirelessly.

The controller may substantially simultaneously or individually control ON/OFF of the first light source 200 and/or the second light source 300 such that the first light source 200 and/or the second light source 300 emit the lights for a predetermine period at a predetermined intensity.

In the exemplary embodiment of the present disclosure, the controller may control whether to operate or not the first light source 200 and the second light source 300 according to a preset process or according to a user's input. For example, the controller may not operate the first and second light sources 200 and 300 for a first time, may operate the first light source 200 for a second time, and may operate the second light source 300 for a third time in sequence. Alternatively, a user may manually input a duration of the first time, the second time, and the third time and an intensity of the light of the first light source 200 and/or the second light source 300.

According to the exemplary embodiment of the present disclosure, the controller may be connected to the water supply unit in addition to the first light source 200 and/or the second light source 300. The controller may control an amount of water supplied through the water supply unit and a time during which the water is supplied.

For example, the water supply unit 110 may supply water to the seeds 400 at predetermined time intervals without a user's operation. The intervals at which water is supplied to the seeds 400 may be modified depending on the type of the seeds 400. In the case of plants of the Cichorioideae subfamily that require a lot of water for growth, water may be supplied at relatively short intervals, and in the case of plants of the Cichorioideae subfamily that require less water for growth, water may be supplied at relatively long intervals.

Figure 1B:
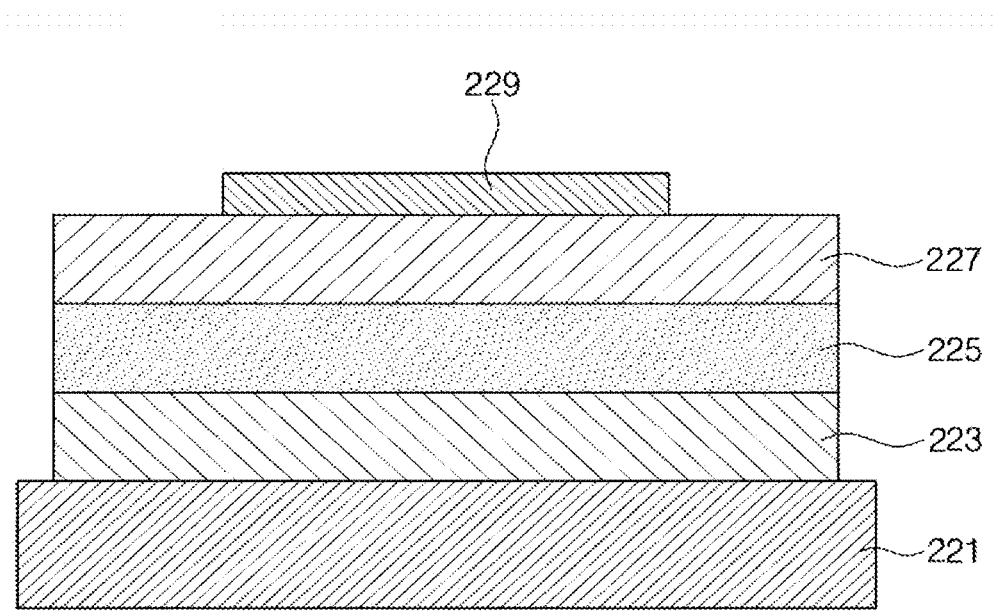
FIG. 1B is a view schematically showing a light emitting diode used in first and second light sources.

FIG. 1B is a view schematically showing the light emitting diode used in the first and second light sources.

Referring to FIG. 1B, the light emitting diode may include a light emitting structure including a first semiconductor layer 223, an active layer 225, and a second semiconductor layer 227, a first electrode 221 connected to the light emitting structure, and a second electrode 229 connected to the light emitting structure.

The first semiconductor layer 223 is a semiconductor layer doped with a first conductive type dopant. The first conductive type dopant may be a p-type dopant. The first conductive type dopant may be Mg, Zn, Ca, Sr, or Ba. In the present exemplary embodiment, the first semiconductor layer 223 may include a nitride-based semiconductor material. In the present exemplary embodiment of the present disclosure, the material for the first semiconductor layer 223 may be GaN, AlN, AlGaN, InGaN, InN, InAlGaN, or AlInN.

The active layer 225 is disposed on the first semiconductor layer 223 and corresponds to a light emitting layer. The active layer 225 is a layer in which electrons (or holes) injected through the first semiconductor layer 223 and holes (or electrons) injected through the second semiconductor layer 227 meet each other and emit a light due to a band gap difference of an energy band according to a material for forming the active layer 225.

The active layer 225 may be implemented with a compound semiconductor. The active layer 225 may be implemented with, for example, at least one of compound semiconductors of Groups III-V or II-VI.

The second semiconductor layer 227 is disposed on the active layer 225. The second semiconductor layer 227 is a semiconductor layer doped with a second conductive type dopant having a polarity opposite to that of the first conductive type dopant. The second conductive type dopant may be an n-type dopant, and the second conductive type dopant may be, for example, Si, Ge, Se, Te, O, or C.

In the exemplary embodiment of the present disclosure, the second semiconductor layer 227 may include a nitride-based semiconductor material. The material for the second semiconductor layer 227 may be GaN, AlN, AlGaN, InGaN, InN, InAlGaN, or AlInN.

The first electrode 221 and the second electrode 229 may be provided in various forms to be respectively connected to the first semiconductor layer 223 and the second semiconductor layer 227. In the present exemplary embodiment, the first electrode 221 is disposed under the first semiconductor layer 223, and the second electrode 229 is disposed on the second semiconductor layer 227; however, they should not be limited thereto or thereby. In the exemplary embodiment of the present disclosure, the first electrode 221 and the second electrode 229 may include various metals, such as Al, Ti, Cr, Ni, Au, Ag, Sn, W, Cu, or alloys thereof. Each of the first electrode 221 and the second electrode 229 may have a single-layer or multi-layer structure.

In the exemplary embodiment of the present disclosure, the light emitting diode is described as a vertical type light emitting diode, however, the light emitting diode does not necessarily need to be the vertical type and may be provided in other types as long as it corresponds to the concept of the present disclosure.

According to the exemplary embodiment of the present disclosure, the following effects may be obtained by using the light emitting diode instead of a conventional lamp as a light source for applying the light to a sample.

When the light emitting diode according to the exemplary embodiment of the present disclosure is used as the light source, a light having a specific wavelength may be provided to the plants when compared with a light emitted from the conventional lamp (e.g., a conventional UV lamp). The light emitted from the conventional lamp has a broad spectrum in a wide area compared with that of the light emitted from the light emitting diode. Accordingly, in the case of the conventional UV lamp, it is not easy to separate only the light of some bands from the wavelength band of the emitted light. In contrast, the light emitted from the light emitting diode has a sharp peak at a specific wavelength and provides a light of a specific wavelength having a very narrow full-width-half-maximum in comparison with the light from the conventional lamp. Therefore, it is easy to select the light of the specific wavelength, and only the light of the selected specific wavelength may be provided to the sample.

In addition, in the case of the conventional lamp, it is difficult to precisely limit an amount of the light while providing the light to the sample, but in the case of the light emitting diode, it is possible to clearly limit the amount of the light while providing the light. Further, in the case of the conventional lamp, it is difficult to precisely limit the amount of the light, and thus, an irradiation time may be set in a wide range. However, in the case of the light emitting diode, the light required for the sample may be provided for a definite time within a relatively short time.

As described above, in the case of the conventional lamp, it is difficult to clearly determine the amount of the light due to the relatively wide wavelength, the wide range of light amount, and the wide range of irradiation time. In contrast, in the case of the light emitting diode, a clear light dose may be provided due to the relatively narrow range of wavelength, the narrow range of light amount, and the narrow range of irradiation time.

In addition, in the case of the conventional lamp, it takes a long time to reach a maximum amount of light after turning on the power. In contrast, when using the light emitting diode, it reaches the maximum amount of light with substantially no warm-up time after turning on the power. Thus, in the case of the light emitting diode light source, the irradiation time of the light may be accurately controlled when the plants are irradiated with a light of a specific wavelength.

In the exemplary embodiment of the present disclosure, the content of the active ingredients may be altered by irradiating the light to the Asteraceae family plants, for example, the Cichorioideae subfamily plant, by using the first and second light sources under a specific condition.

As the active ingredients whose content is altered in plants by the light from the first and second light sources, there may be chlorophylls, flavonols, anthocyanins, sesquiterpene lactones, and phenolic compounds.

Chlorophylls are known as a photosynthetic pigment of green vegetables and help to prevent bad breath and constipation. Flavonols are antioxidants and include quercetin, kaempferol, and myricetin as its representative substances. Quercetin is an antioxidant with high antioxidant capacity, Kaempferol is known to prevent cancer cell proliferation by enhancing immunity, and Myricetin is known to inhibit accumulation of fat to prevent cardiovascular disease. Anthocyanins are one of representative antioxidants and have the effect of preventing aging by removing reactive oxygen species in human body. Anthocyanins also help re-synthesis of a pigment called rhodopsin in the eye's retina to prevent eye strain, decreased visual acuity, cataract, etc.

Sesquiterpene-based compounds (sesquiterpenoids) are a subgroup of terpene-based compounds (terpenoids), and among them, the sesquiterpene lactones having a lactone structure are known to have functions, such as antitumor activity, cytotoxicity alleviation, and antibacterial action. In particular, lactucin, which belongs to the group of sesquiterpene lactones contained in lettuce, has an effect in improving insomnia. In addition, it is known that the sesquiterpene lactones have relatively good medicinal value in terms of resistance to microbial pathogens, treatment of schistosome infection, and improvement of antiallergic activity.

According to the exemplary embodiment, in a case where an ultraviolet light is applied in a predetermined condition during the cultivation of the seeds of the Cichorioideae subfamily, the sesquiterpene lactones may increase or decrease. When the sesquiterpene lactones increase in plants, it may help to improve insomnia. When the sesquiterpene lactones decrease in the plants, the sleep-inducing phenomenon may be prevented even when the plants of the Cichorioideae subfamily are ingested.

The sesquiterpene lactones may be a substance represented by the following chemical formula 1, and each of R1 and R2 may independently be various functional groups.

Each of R1 and R2 may independently be, for example, substituted or unsubstituted alkyl, alkoxy, allyl, or aryl with from 1 to 18 carbon atoms.

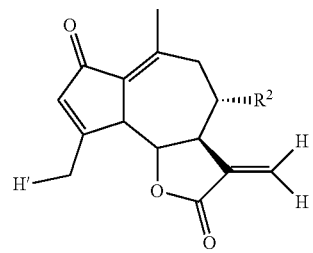

Chemical formula 1

In the exemplary embodiment of the present disclosure, the sesquiterpene lactones may be at least one of lactucin, lactucopicrin, 8-deoxylactucin, picriside A, crepidiaside A, lactucin-15-oxalate, lactucopicrin-15-oxalate, 8-deoxylactucin-15-oxalate, 15-deoxylactucin-8-sulfate, 15-deoxylactucin, 8-deoxylactucin-15-sulfate, and 15-(4-hydroxyphenylacetyl)-lactucin-8-sulfate.

As another example, the sesquiterpene lactones according to the exemplary embodiment of the present disclosure may have the following formulas 2-1 to 2-7.

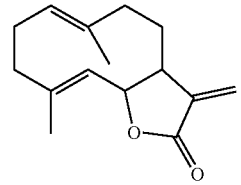

Chemical formula 2-1

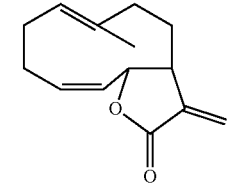

Chemical formula 2-2

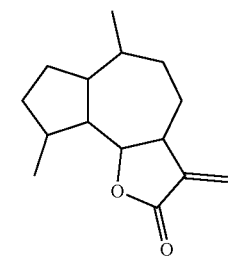

Chemical formula 2-3

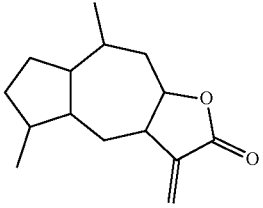

Chemical formula 2-4

Chemical formula 2-5

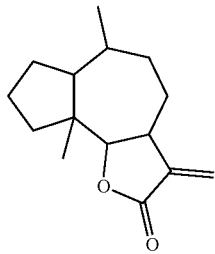

Chemical formula 3-1

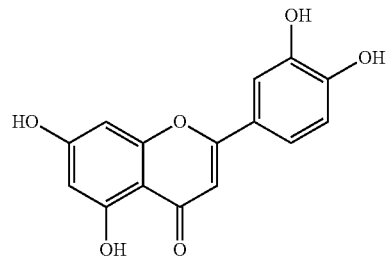

Chemical formula 2-6

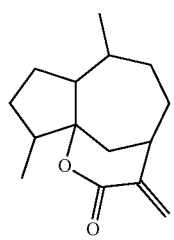

Chemical formula 3-2

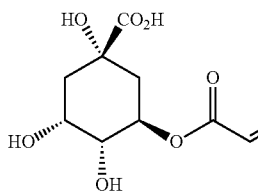

Chemical formula 2-7

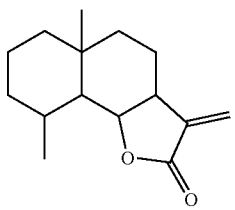

Chemical formula 3-3

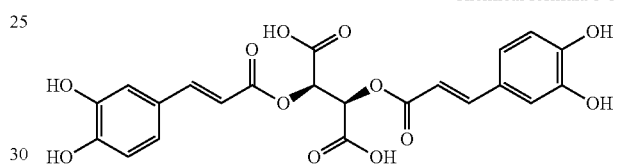

In the exemplary embodiment of the present disclosure, the light irradiated from the second light source 300 increases the phenolic compound in the plants grown from the seeds 400. In detail, the light irradiated from the second light source 300 and having the second wavelength band activates secondary metabolism of the plants, and thus the content of the phenolic compounds, which are secondary metabolites, may increase. When the light in the second wavelength band is irradiated to the plants, the light having the above-described wavelength causes a DNA-damaging effect on cells of the plants, and as a result, the generation of phenolic compounds, which are capable of absorbing the light having the above-mentioned wavelength, may be promoted. The phenolic compounds correspond to antioxidants included in the plants grown from the seeds 400.

In the exemplary embodiment of the present disclosure, the phenolic compounds may include substances represented by the following chemical formulas 3-1 to 3-3. The substances represented by the following formulas 3-1 to 3-3 correspond respectively to luteolin, chlorogenic acid, and chicoric acid. In this case, chlorogenic acid is a natural compound composed of an ester of caffeic acid and quinic acid and is a biological antioxidant. The chlorogenic acid is known to neutralize damaging effects of peroxides.

According to the exemplary embodiment of the present disclosure, when the light is irradiated to the Asteraceae family plant, for example, the Cichorioideae subfamily plant, by using the first and second light sources under a specific condition, the content of the active ingredients may increase, and also, the effect of having and retaining the inherent color of each Cichorioideae subfamily plant may be obtained.

According to an exemplary embodiment of the present disclosure, when the light source for plant cultivation is used, it is possible to independently provide a growing environment suitable for the types of plants even under conditions in which the sunlight is insufficient, or the sunlight is not provided. Particularly, the marketability of plants may increase by providing the growth environment that may retain the inherent color of the plants. In the case of a conventional plant factory that grows plants without sunlight, the plants grown in the plant factory have no anthocyanin or very small amounts of anthocyanins, and as a result, the plants have a problem in that they do not have the inherent color of the plants. For example, the Chicoriaceae subfamily plant such as the red leaf lettuce (Jeokchima) usually appear reddish, but appear very pale reddish or have no red color when they are grown in the plant factory without sunlight. In a case where the plant does not have the inherent color it should have, a consumer may determine that the plant is defective, resulting in poor marketability. However, according to the exemplary embodiment of the present disclosure, the content of anthocyanin among the active ingredients of the plant significantly increases by appropriately applying the first light and the second light to the plant, particularly, by applying the second light to the plant for a predetermined time duration before harvesting, and as a result, the plant has a color close to its inherent color. This leads to an improvement in the marketability. In the exemplary embodiment of the present disclosure, the light provided to the Asteraceae family plants, for example, the Cichorioideae subfamily plant may be provided during different periods. Here, the term "period" means a temporal period. For example, when the light emitted from the first light source is referred to as a "first light" and the light emitted from the second light source is referred to as a "second light", the light corresponding to the first light may be provided during a portion of the period, and both the first light and the second light may be provided during the other portion of the period except for the portion of the period. Hereinafter, for convenience of explanation, the period in which the first light is provided will be referred to as a "first period", and the period in which the first light and the second light are provided will be referred to as a "second period". In other words, only the above-described first light source may be turned on in the first period, and both the first light source and the second light source may be turned on in the second period.

In the present exemplary embodiment of the present disclosure, the first period, or the second period is a period in which the light having the visible light wavelength band is provided and corresponds to a predetermined period in the light condition. In the present exemplary embodiment of the present disclosure, the second period is shorter than the first period.

In the present exemplary embodiment of the present disclosure, the first period and the second period may be arranged in various ways depending on the growth stage and the harvest time of the plants. For example, the first period may be arranged before the harvesting of the plants after the plants are transplanted. The second period may be arranged adjacent to the first period and may be arranged right before the harvesting time within an overall schedule. In other words, the first period may be continued after the transplanting of the plants, and the second period may be arranged at a time other than the first period right before harvesting. Then, the plants are harvested. In the exemplary embodiment of the present disclosure, the second period may be provided between the first periods over 10 days or less before harvesting. In some embodiments, the second period may be provided between the first periods over several days. In this case, a cumulative applied amount of the provided second light may be, for example, about 4.032 kJ/m$^2$, about 2.880 kJ/m$^2$, or about 2.304 kJ/m$^2$.

In the present exemplary embodiment of the present disclosure, the plants may be cultivated under the light period and the dark period, which are alternated for about 20 days after the transplanting of the plants. That is, the first period and the second period are sequentially repeated in the light period, and the first period and the second period, which are next to each other, form a one repetition period. In the repetition period, the light provided in the second period is not provided in the first period.

After being transplanted, the light period may include only the first period for about 14 days (e.g., from tenth day to twenty-third day after sowing). Then, the light period may include the first period and the second period, which are alternately arranged with each other, for about 7 days from fifteenth day to twentieth day after being transplanted (e.g., from twenty-fourth day to thirtieth day after sowing). That is, the first period and the second period are sequentially repeated in the light period. In other words, the irradiation of light is repeated with a cycle of about 10 minutes, and the second light is irradiated for about 1 minute and then has a rest period of about 9 minutes. This cycle is continuously repeated during the light period.

In the present exemplary embodiment of the present disclosure, a cumulative energy amount per day of the second light irradiated to the plant during the second period may be about 0.58 kJ/m$^2$, and a total cumulative energy amount from the sowing to the harvest may be about 4.03 kJ/m$^2$. In the above descriptions, the simple Cichorioideae subfamily plant cultivation device in a simple form according to the exemplary embodiment of the present disclosure has been described. However, since the Cichorioideae subfamily plant cultivation device according to the exemplary embodiment of the present disclosure may be used for commercial plant production, other forms of the Cichorioideae subfamily plant cultivation device for use in commercial plant production will be described in detail.

Figure 2:
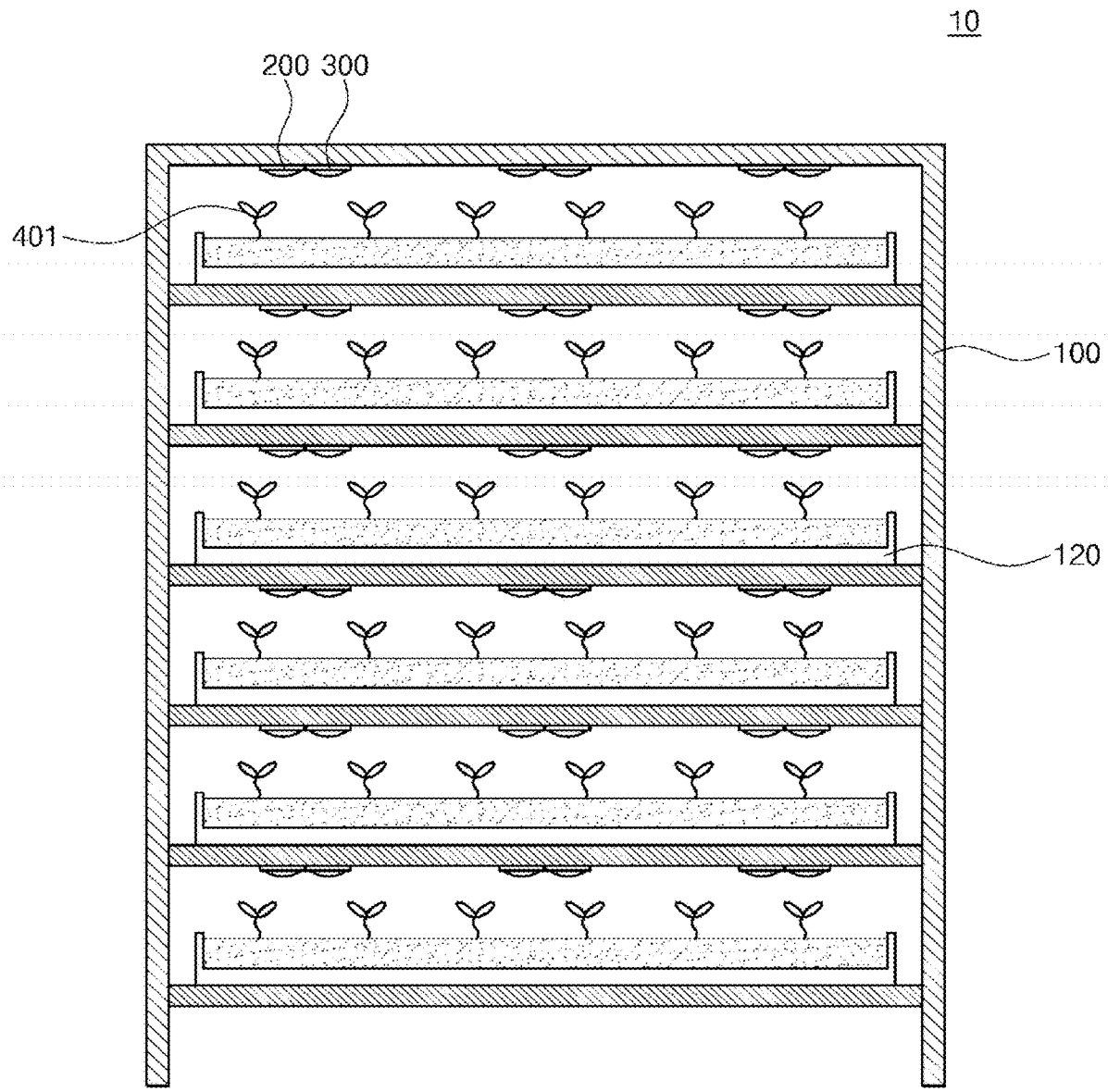
FIG. 2 is a cross-sectional view showing a Cichorioideae subfamily plant cultivation device according to an exemplary embodiment of the present disclosure.

FIG. 2 is a cross-sectional view showing the Cichorioideae subfamily plant cultivation device according to an exemplary embodiment of the present disclosure.

The plant cultivation device 10 according to an exemplary embodiment of the present disclosure may be operated in the form of a large factory for obtaining a large amount of plants of the Cichorioideae subfamily, i.e., a plant production facility, as well as a culturing device for home use or personal use to cultivate a relatively small amount of plants of the Cichorioideae subfamily. Therefore, the plant cultivation device 10 may include a plurality of culture platforms 120, first light sources 200, second light sources 300, and water supply units (not shown).

As shown in figures, the culture platforms 120, the first light sources 200, and the second light sources 300 may define several compartments. Therefore, a main body 100 may be provided in a structure that includes the several compartments.

The several compartments included in the main body 100 may be operated independently of each other. For example, the first light source 200 provided in some compartments may emit more blue light than red light, and the first light source 200 provided in other compartments may emit more red light than blue light. In addition, each compartment of the main body 100 may be operated differently in terms of time. For example, the first light source 200 may emit the light in a first wavelength band in some compartments to grow plants 401, and the second light source 200 may emit the light in a second wavelength band in other compartments to increase or decrease the active ingredient content in the plants 401.

Each compartment included in the main body 100 may be configured to form a closed dark room to be independently operated as described above. Therefore, the light(s) emitted from the first light source 200 and/or the second light source 300 and provided to an arbitrary compartment may not exert an influence on other compartments.

The culture platform 120 provided in the main body 100 may include different culture media from each other depending on the type of the plants 401. Thus, it is possible to provide the growth environment customized to the type of the plants 401. In addition, the culture platform 120 may be separated from the main body 100. Accordingly, when the plants 401 growing on some culture platforms 120 reach a harvesting stage, users may separate only the culture platform 120 on which the plants 401 completely grown are provided from the main body 100 without affecting the plant cultivation device 10.

The main body 100 may further include a water supply unit, and the water supply unit is provided on a surface at which the main body 100 and the culture platform 120 contact each other to directly supply water to the culture medium included in the culture platform 120. Therefore, different from a spray-type water supply unit, water may be supplied without affecting other culture platforms 120 even when the culture platforms 120 are stacked.

Two or more of the first light source 200 may be provided depending on shape of the culture platform 120. As described above, the first light source 200 may include a plurality of light emitting diodes that emits lights having different wavelengths, and the light emitting diodes may be provided in the same ratio or different ratios in the first light source 200. When the light emitting diodes that emit the lights having the different wavelengths are provided in the same ratio in the first light source 200, the first wavelength band may be controlled by a controller to correspond to the type of the plants 401. Therefore, the growth environment suitable for the type of the plants 401 may be provided.

Two or more of the second light source 300 may be provided. The second light sources 300 may be provided in different compartments from each other in the main body 100 and may be independently operated. Accordingly, the light in the second wavelength band may be irradiated to only the completely grown plants 401 in a phase where the active ingredient content is to be increased or decreased.

In the exemplary embodiment of the present disclosure, various sensors, e.g., a temperature sensor, a humidity sensor, and a light intensity sensor, may be additionally disposed in the controller of the plant cultivation device operated in the plant production facility, and the controller may receive data from the sensors and may control the first and second light sources and the water supply unit as a whole or individually. The culturing device equipped with the plant cultivation system may transmit and receive data either directly or from a remote location by wired, wireless, or internet connection and may display data from the various sensors, the first and second light sources, and the water supply unit through a separate display. The user may instruct the controller 40 to implement optimal conditions after reviewing such data.

As described above, the plants of the Cichorioideae subfamily with the altered active ingredient content may be easily cultivated in large quantities by using the plant cultivation device 10 according to the exemplary embodiment of the present disclosure. Through the culturing method as the exemplary embodiment of the present disclosure, it is possible to obtain a large amount of non-synthetic active ingredients in a natural state. The active ingredients obtained in large quantity may be processed in the form of medicines, health supplements, and various ingredients through a separate processing process. For example, the plants of the Cichorioideae subfamily with a high active ingredient content may be lyophilized immediately after harvest to allow the highest active ingredient content right after harvest to be maintained in the final product. The lyophilized plants of the Cichorioideae subfamily may be processed into various forms. For example, they may be processed in powder form or may be processed to extract only the active ingredients through a separate process. Thus, users may consume plants of the Cichorioideae subfamily having the high active ingredient content either in the form of plants or in the form of processed products through separate processing processes.

Further, the plural plants 401 may be substantially simultaneously cultivated using the plant cultivation device according to the exemplary embodiment of the present disclosure, and the growth environment suitable for the type of the plants 401 may be independently provided. Accordingly, the plants 401 whose types are different from each other may be substantially simultaneously cultivated by using the plant cultivation device 10.

According to the exemplary embodiment of the present disclosure, when the light source for plant cultivation is used, it is possible to independently provide a growing environment suitable for the types of plants even under conditions in which the sunlight is insufficient, or the sunlight is not provided. In addition, the plant that has the inherent color thereof and having the high active ingredient content may be easily cultivated.

EMBODIMENT

1. Growth Conditions and Light Treatment Conditions for Plants 1

In the following embodiment examples, experiments were carried out on the Cichorioideae subfamily plant, which belongs to the Asteraceae family plants, as a representative example. The Cichorioideae subfamily plant was harvested on the 31st day (grown for 31 days). The Cichorioideae subfamily plant was cultivated under conditions of a temperature of about $22\pm1°$ C. and a relative humidity of about $70\pm10\%$ during the growth period. The first and second lights were provided by the light emitting diode during the growth period.

The growth conditions of a comparative example and experimental examples were shown in FIGS. 3A and 3B. Hereinafter, for the convenience of explanation, the period in which the first light is provided is represented as the first period, and the period in which the first and second lights are provided is represented as the second period.

Referring to FIGS. 3A and 3B, the Cichorioideae subfamily plant was germinated in the dark period for about 2 days after the sowing. In other words, seeds of the Cichorioideae subfamily plant were first sowed into a cultivation sponge and germinated in the dark period for about 2 days to grow the Cichorioideae subfamily plant.

The Cichorioideae subfamily plant was grown in the light period and the dark period from day 3 to day 9 after sowing, and this corresponds to an irradiation period before transplanting. The light was irradiated to the Cichorioideae subfamily plant in the light period at a light intensity of about 60 µmol/m2/s PPFD (Photosynthetic Photon Flux Density). Only the purified water was provided to the plants after sowing and before transplanting.

The grown sprouts were transplanted in a deep-flow technique (DFT) hydroponic culture system on the 10th day. The transplanted Cichorioideae subfamily plant was grown in nutrient solution under the light and dark periods. As the nutrient solution, Hoagland stock solution was used, and the pH of the nutrient solution was maintained at about 5.5 to about 6.5.

In the comparative example, after the transplanting, the light period and the dark period were provided on the 24-hour basis for about 20 days. On the 24-hour basis, the light period was maintained for about 16 hours, and the dark period was maintained for about 8 hours. After the transplanting, the first light was provided in the light period for about 20 days, and the second light was not provided. That is, in the case of comparative example, the irradiation period after the transplanting may include only the first period in the light period. In this case, the first light was irradiated in the light period at a light intensity of about 150 µmol/m2/s PPFD (Photosynthetic Photon Flux Density).

In experimental example 1, after the transplanting, the light period and the dark period were provided on the 24-hour basis for about 20 days. On the 24-hour basis, the light period was maintained for about 16 hours, and the dark period was maintained for about 8 hours. After the transplanting, the first light was provided in the light period for about 20 days, and the second light was provided for about 6 hours at the start of the light period on 20th day after the transplanting. Accordingly, in experimental example 1, the irradiation period after the transplanting may include only the first period in the light period for about 19 days and may include the second period and the first period in the light period on 20th day. In detail, in experimental example 1, the first light was continuously irradiated during the light period on 20th day (on 30th day after sowing) after transplanting, and the second light was continuously irradiated for about 6 hours in some periods. Here, the first light was irradiated in the light period at a light intensity of about 150 μmol/m2/s PPFD (Photosynthetic Photon Flux Density), and a total cumulative energy amount of the second light provided in the second period was about 2.16 kJ/m$^2$.

In experimental example 2, after the transplanting, the light period and the dark period were provided on the 24-hour basis for about 20 days. On the 24-hour basis, the light period was maintained for about 16 hours, and the dark period was maintained for about 8 hours. In experimental example 2, the second light was irradiated to the plants in an on and off manner in the light period. That is, the irradiation of the second light was repeated with a 10-minutes cycle in which a 1-minute irradiation of the second light is followed by a 9-minute non-irradiation in the light period. In experimental example 2, an amount of UV irradiation energy processed per day was about 0.576 kJ/m$^2$. In experimental example 2, the UV was irradiated after sowing, and a total amount of UV irradiation energy was about 4.032 kJ/m$^2$.

In the comparative Example, experimental example 1, and experimental example 2, only the irradiation of the second light, the irradiation time of the second light, and the irradiation energy of the second light were different, and all other conditions were kept the same. In this case, the first light was a light having the visible light wavelength band, and the second light was a light having a UVB wavelength band, for example, a wavelength of about 285 nm.

Then, the Cichorioideae subfamily plant was harvested on thirty-first day.

2. Comparison of Appearance of Green Leaf Lettuce (Cheongchima) According to Comparative Example and Experimental Examples 1 and 2

In this experiment, green leaf lettuce (Cheongchima) was cultivated as Comparative example and Experimental examples 1 and 2 under the conditions shown in FIGS. 3A and 3B, and was examined for damage to its appearance after harvesting.

Figure 4A:
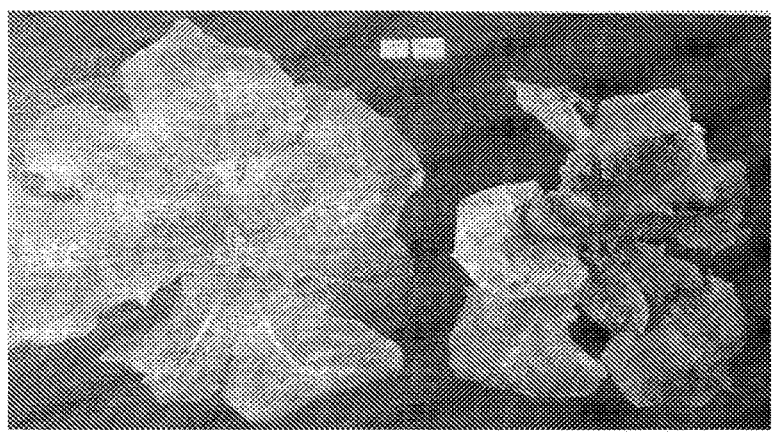
FIG. 4A is a photograph showing an appearance of a green leaf lettuce (Cheongchima) according to a comparative example and an experimental example 1.
Figure 4B:
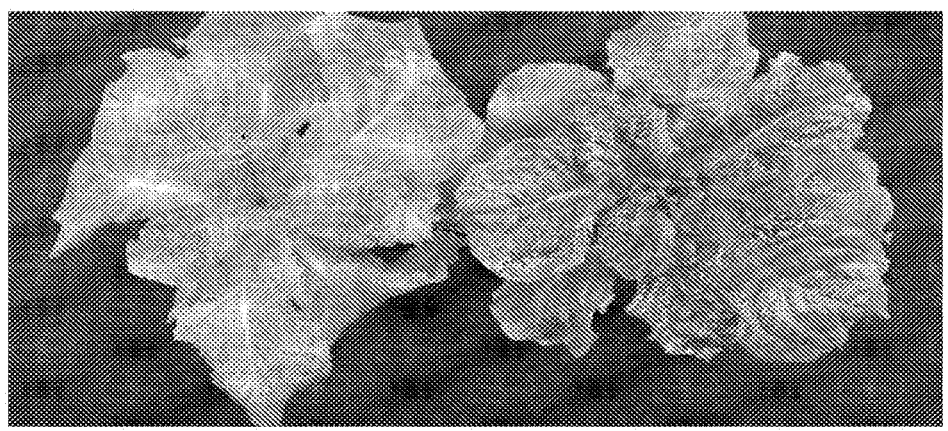
FIG. 4B is a photograph showing an appearance of a green leaf lettuce (Cheongchima) according to a comparative example and an experimental example 2.
Figure 5A:
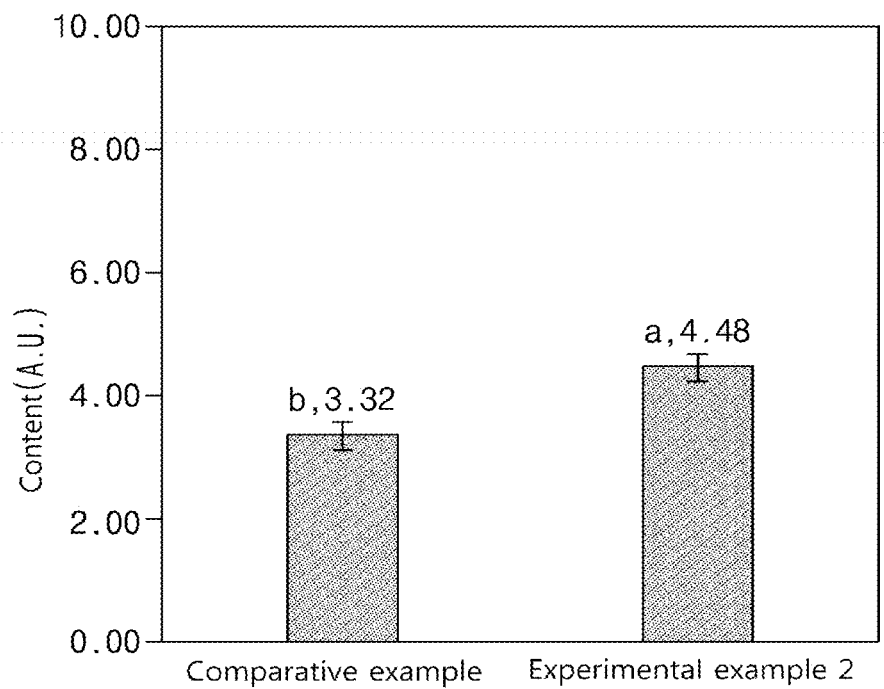
FIGS. 5A to 5D are graphs showing a content of an active ingredient contained in the green leaf lettuce (Cheongchima) after harvest in the comparative example and experimental example 2 where.
Figure 5B:
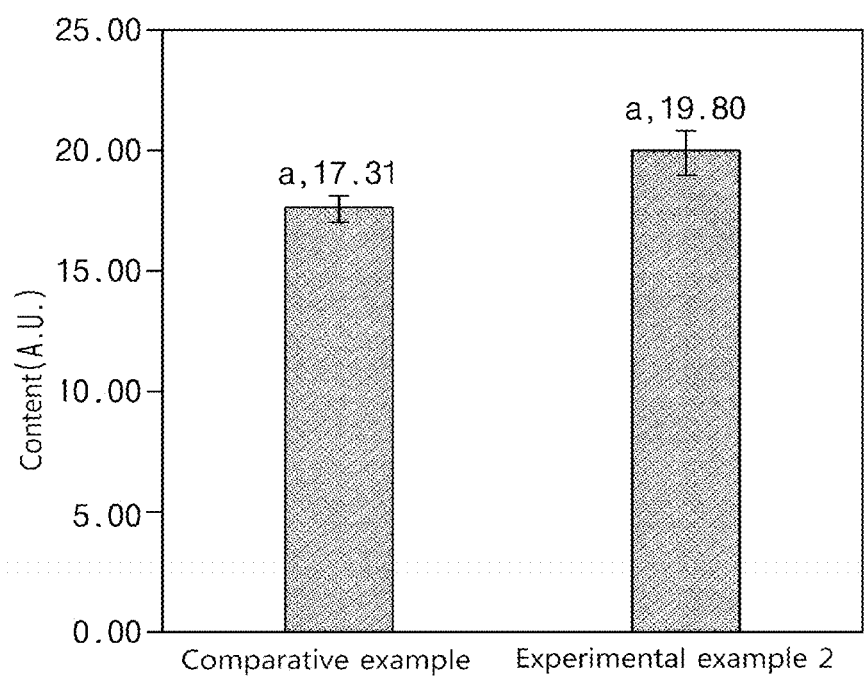
Figure 5C:
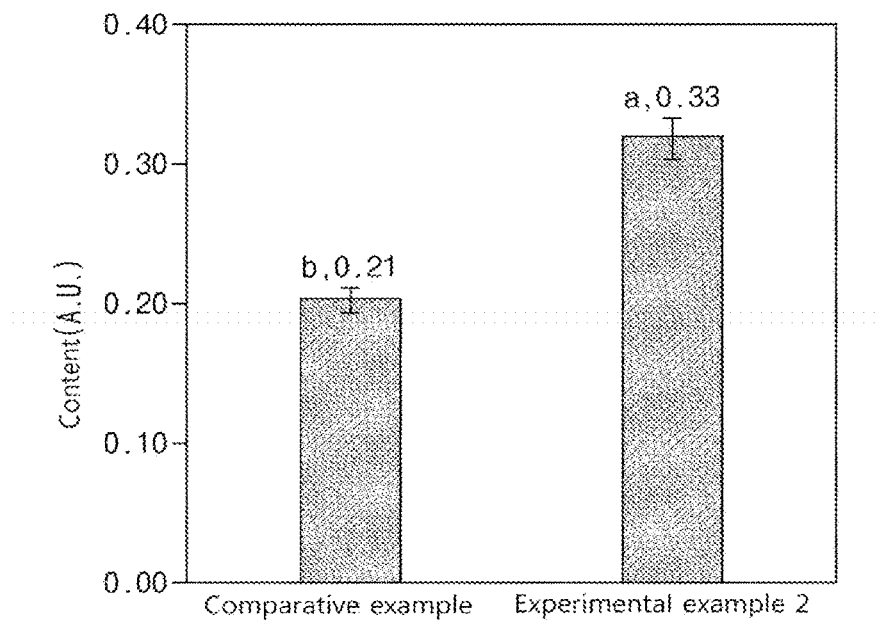
Figure 5D:
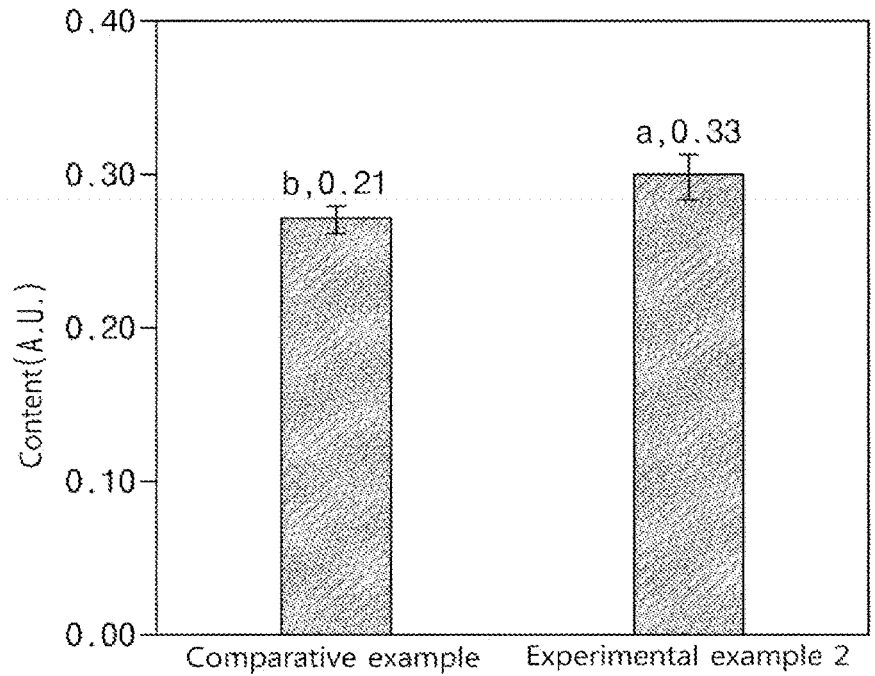

FIG. 4A is a photograph showing the appearance of the green leaf lettuce (Cheongchima) according to the comparative example and experimental example 1. FIG. 4B is a photograph showing the appearance of the green leaf lettuce (Cheongchima) according to Comparative example and Experimental example 2. In FIG. 4A, the left green leaf lettuce (Cheongchima) corresponds to Comparative example, and the right green leaf lettuce (Cheongchima) corresponds to Experimental example 1. In FIG. 4B, the left green leaf lettuce (Cheongchima) corresponds to the Comparative example, and the right green leaf lettuce (Cheongchima) corresponds to Experimental example 2.

Referring to FIGS. 4A and 4B, there was no damage to appearance in the Comparative example. However, leaf curling phenomenon in which leaves are dried and curled at the tip was observed and leaves turned brown in Experimental example 1. On the other hand, in Experimental example 2, no difference was found from Comparative example, and there was no damage to the overall appearance.

As described above, in Experimental example 1, although the cumulative energy amount of the second light was about 2.16 kJ/m$^2$, which is much smaller than the cumulative energy amount the second light of about 4.03 kJ/m$^2$ in Experimental example 2, it was found that the damage of the appearance was very large. It is determined that the damage of appearance was due to the continuous irradiation of the second light. Accordingly, it was found that the damage of appearance was minimized in the case of light irradiation in an on and off manner even though the amount of energy was large.

3. Comparison of Active Ingredient Content of Comparative Example and Experimental Example 2

FIGS. 5A to 5D are graphs showing the content of the active ingredients contained in the green leaf lettuce (Cheongchima) after harvest in Comparative example and Experimental example 2. The active ingredients in FIGS. 5A to 5D sequentially correspond to chlorogenic acids, chlorophylls, flavonoids, and anthocyanins.

To obtain results according to Comparative example and Experimental example 2, the plants were harvested on the 31st day after sowing, and contents of chlorogenic acids, chlorophylls, flavonols, and anthocyanins were measured by providing a light to the leaf using an optical sensor called Dualex, that is a non-destructive analyzer. A total of 18 green leaf lettuces (Cheongchima) were measured (n=18).

Referring to FIGS. 5A to 5D, in Experimental example 2, a significant increase in the content of active ingredients was observed in comparison with the Comparative example. That is, when the second light is applied to the plants, the active ingredients corresponding to chlorogenic acids, chlorophylls, flavonols, and/or anthocyanins were significantly increased.

4. Comparison of Other Cichorioideae Subfamily Plants of Comparative Example and Experimental Example 2

Figure 6A:
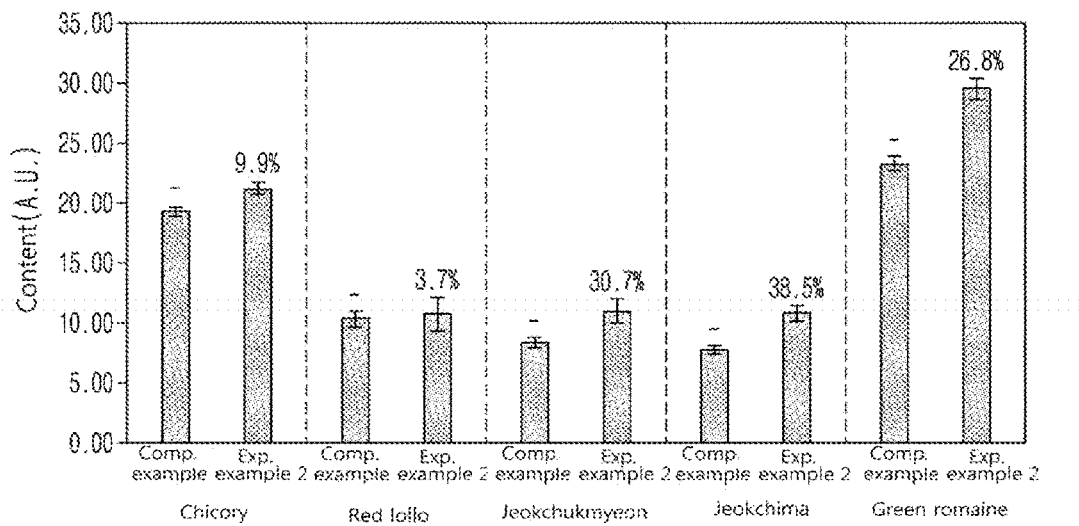
FIGS. 6A to 6C are graphs showing a content of an active ingredient contained in other Cichorioideae subfamily plants after harvest in the comparative example and experimental example 2 where.
Figure 6B:
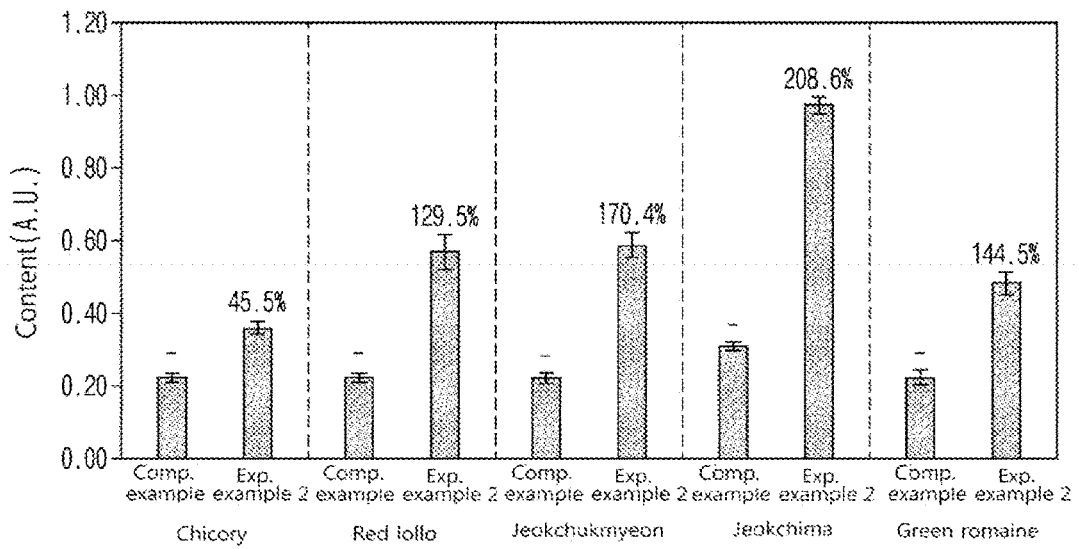
Figure 6C:
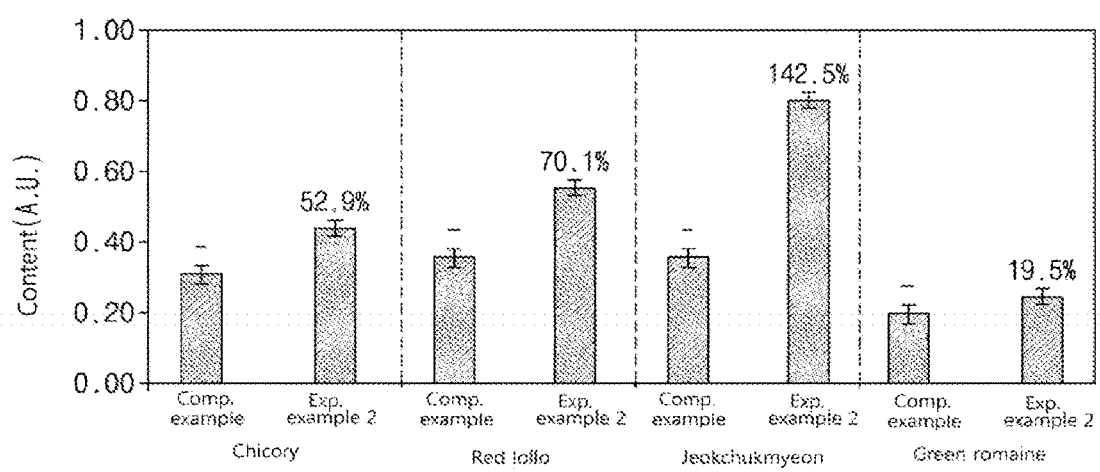
Figure 7A:
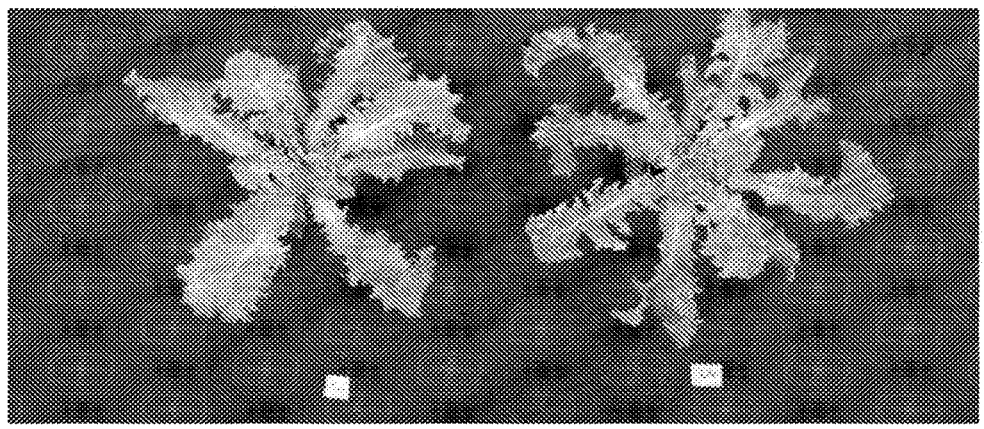
FIGS. 7A to 7F are photographs showing an exterior color of the Cichorioideae subfamily plants after harvest in the comparative example and experimental example 2 where.
Figure 7B:
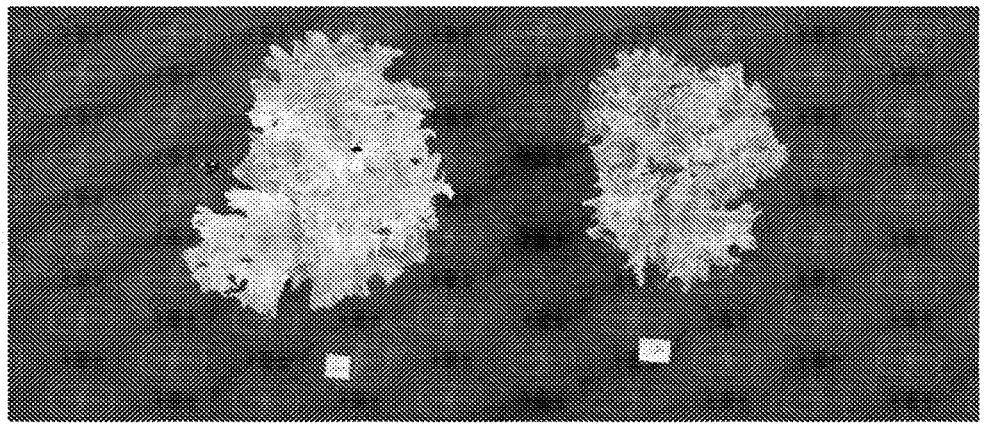
Figure 7C:
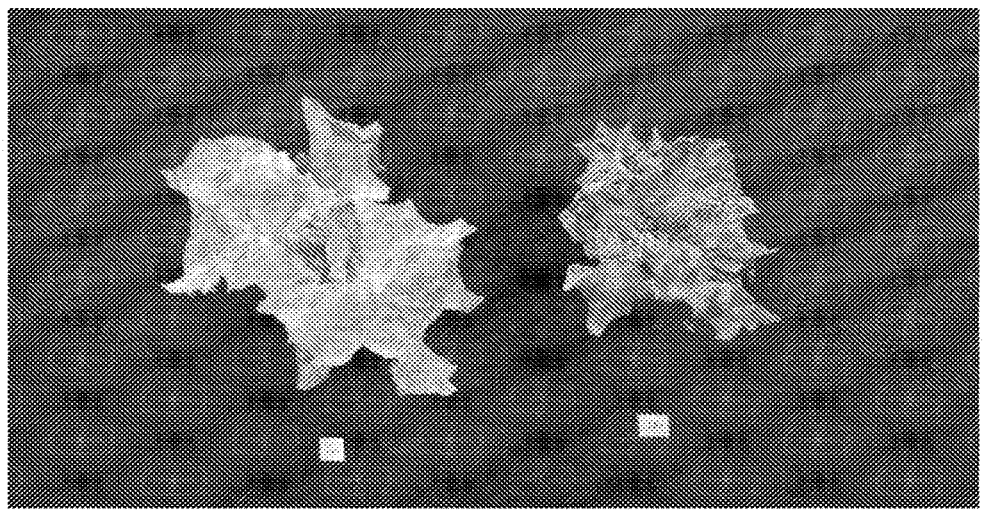
Figure 7D:
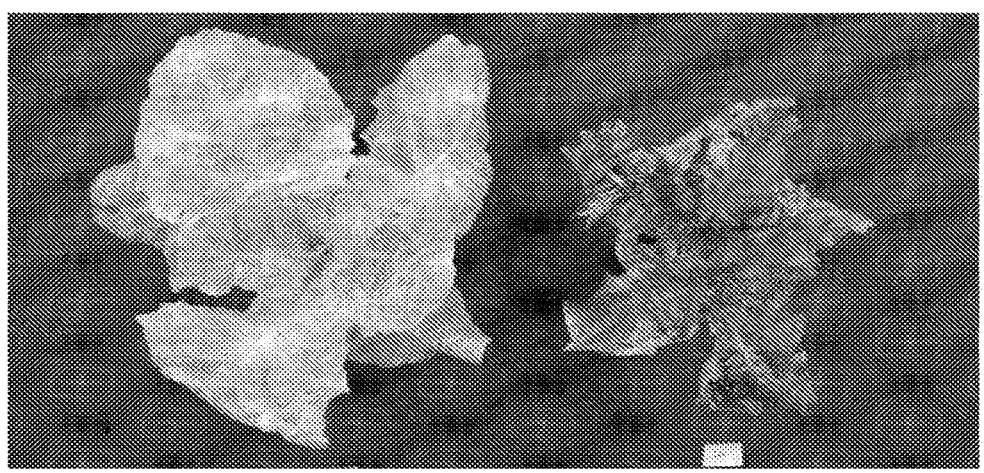
Figure 7E:
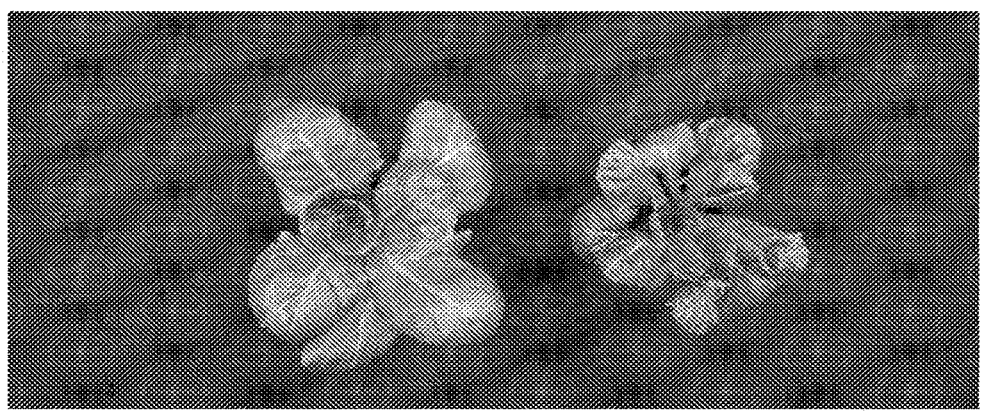
Figure 7F:
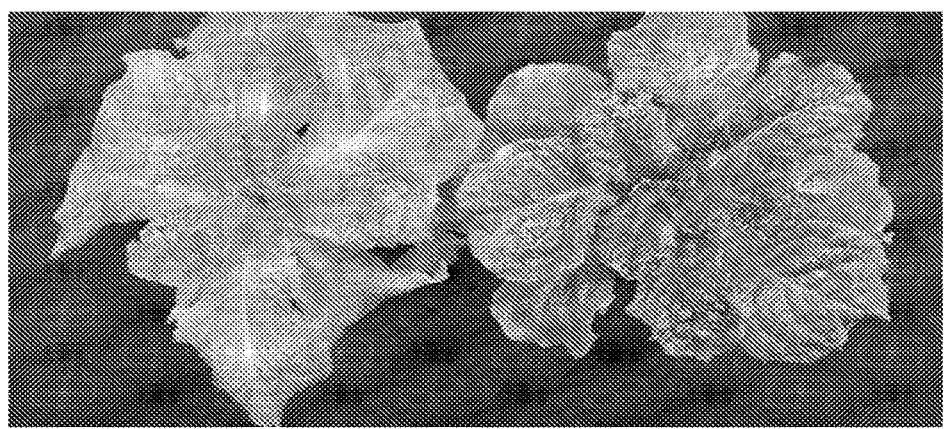

FIGS. 6A to 6C are graphs showing the content of the active ingredients contained in other Cichorioideae subfamily plants after harvest in Comparative example and Experimental example 2.

In FIGS. 6A and 6B, chicory, red lollo rosso red leaf lettuce, red leaf lettuce (Jeokchukmyeon), red leaf lettuce (Jeokchima), and green romaine were experimented as the Cichorioideae subfamily plant, and in FIG. 6C, chicory, red lollo rosso red leaf lettuce, red leaf lettuce (Jeokchukmyeon), and green romaine were experimented as the Cichorioideae subfamily plant. Each active ingredient was measured with respect to chlorophylls, flavonols, and anthocyanins, and the graphs of FIGS. 6A, 6B, and 6C sequentially correspond to chlorophylls, flavonols, and anthocyanins.

To obtain results according to Comparative example and Experimental example 2, each of the plants were harvested on the 31$^{st}$ day after sowing, contents of chlorophylls, flavonols, and anthocyanins were measured by providing a light to the leaf using an optical sensor called Dualex, is a non-destructive analyzer. A total of 18 plants were measured (n=18).

Referring to FIGS. 6A to 6C, it was found that the active ingredients in chicory, red lollo rosso red leaf lettuce, red leaf lettuce (Jeokchukmyeon), red leaf lettuce (Jeokchima), and green romaine corresponding to the Cichorioideae subfamily plant were significantly increased in experimental example 2 compared with the comparative example.

5. Comparison of Exterior Color of Cichorioideae Subfamily Plants of Comparative Example and Experimental Example 2

FIGS. 7A to 7F are photographs showing the exterior colors of the Cichorioideae subfamily plants after harvest in Comparative example and Experimental example 2.

FIGS. 7A to 7F are photographs of chicory, red lollo rosso red leaf lettuce, red leaf lettuce (Jeokchukmyeon), red leaf lettuce (Jeokchima), romaine lettuce, and green leaf lettuce (Cheongchima) among the Cichorioideae subfamily plants in sequence. In FIGS. 7A to 7F, the left plant corresponds to the result in Comparative example of each Cichorioideae subfamily plant, and the right plant corresponds to the result in Experimental example 2 of each Cichorioideae subfamily plant.

Referring to FIGS. 7A to 7F, no damage to appearance was observed in all of Comparative example and Experimental example 2. However, Comparative examples were all green. On the other hand, in Experimental example 2, in the case of the plant in which the inherent color is partially red, for example, red llolo lettuce, red leaf lettuce (Jeokchukmyeon), and red leaf lettuce (Jeokchima), it is clear that the results according to Experimental example 2 were significantly red compared with the result according to Comparative examples. The red color of the plants is due to anthocyanins, and thus it may be concluded from the above experimental result that the content of anthocyanins was increased by applying the second light to the plants, thereby affecting the color of the plants.

6. Growth Conditions and Light Treatment Conditions for Plants 2

In the following embodiment examples, experiments were carried out on the red leaf lettuce (Jeokchima) among the Cichorioideae subfamily plants, which belong to the Asteraceae family plants, as a representative example. The Cichorioideae subfamily plant was cultivated under conditions of a temperature of about 22±1° C. and a relative humidity of about 70±10% during the growth period. The first and second lights were provided using light emitting diodes during the growth period.

The red leaf lettuce (Jeokchima) was harvested on the 31st day (grown for 31 days). The growth conditions of the red leaf lettuce (Jeokchima) according to Comparative example and Experimental examples are shown in FIGS. 8A and 8B. Hereinafter, in drawings, for the convenience of explanation, a period during which the first light is irradiated is shown as the first period, and a period during which the first and second lights are irradiated is shown as the second period.

Referring to FIGS. 8A and 8B, the red leaf lettuce (Jeokchima) was germinated in the dark period for about 2 days after sowing. In other words, red leaf lettuce (Jeokchima) seeds were first sowed into a cultivation sponge and germinated in the dark period for about 2 days to grow the red leaf lettuce (Jeokchima).

The red leaf lettuce (Jeokchima) was grown in the light period and the dark period from day 3 to day 9 after sowing, and this corresponds to an irradiation period before transplanting. The first light was irradiated to the red leaf lettuce (Jeokchima) in the light period at a light intensity of about 60 μmol/m2/s PPFD. Only the purified water was provided to the plants after sowing and before transplanting.

The grown sprouts were transplanted in a deep-flow technique (DFT) hydroponic culture system on the 10th day. The transplanted red leaf lettuce (Jeokchima) was grown with nutrient solution under the light and dark periods. As the nutrient solution, Hoagland stock solution was used, and the pH of the nutrient solution was maintained at about 5.5 to about 6.5.

In Comparative example, after the transplanting, the light period and the dark period were provided on the 24-hour basis for about 20 days. On the 24-hour basis, the light period was maintained for about 16 hours, and the dark period was maintained for about 8 hours. After the transplanting, the first light was provided in the light period for about 20 days, and the second light was not provided. That is, in the case of Comparative example, the irradiation period after the transplanting may include only the first period in the light period. In this case, the first light was irradiated in the light period at a light intensity of about 150 μmol/m2/s PPFD.

In Experimental examples 1 to 3, after the transplanting, the light period and the dark period were provided on the 24-hour basis for about 20 days. On the 24-hour basis, the light period was maintained for about 16 hours, and the dark period was maintained for about 8 hours. In Experimental examples 1 to 3, the second light was irradiated to the plants in the on and off manner in the light period. That is, in Experimental examples 1 to 3, the second light was irradiated in an on and off manner with a repeated cycle of about several minutes in which light irradiation of several minutes is followed by a rest period of a predetermined time. In experimental examples 1 to 3, an amount of UV irradiation energy processed per a day was about 0.576 kJ/m$^2$, the method of irradiation was the same with each other, and only the date from which the treatment started and the total amount of irradiation energy were different in each experimental examples.

In Experimental example 1, the UV was irradiated after sowing, and a total amount of UV irradiation energy was about 2.304 kJ/m$^2$. In Experimental example 2, the UV was irradiated after sowing, and a total amount of UV irradiation energy was about 2.880 kJ/m$^2$. In Experimental example 3, the UV was irradiated after sowing, and a total amount of UV irradiation energy was about 4.302 kJ/m$^2$.

7. Comparison of Active Ingredient Content of Comparative Example and Experimental Examples 1 to 3

Figure 9A:
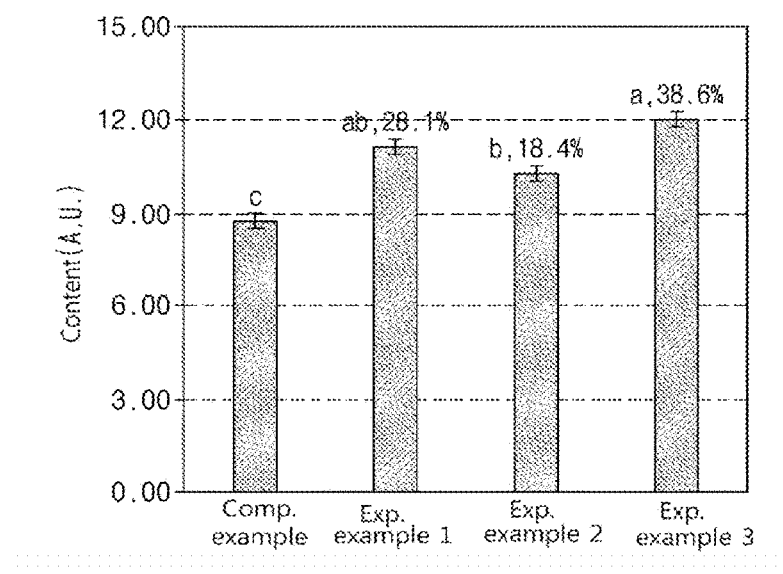
FIGS. 9A to 9D are graphs showing a content of an active ingredient and a weight of the red leaf lettuce (Jeokchima) product after harvest in the comparative example and experimental examples 1 to 3, where.
Figure 9B:
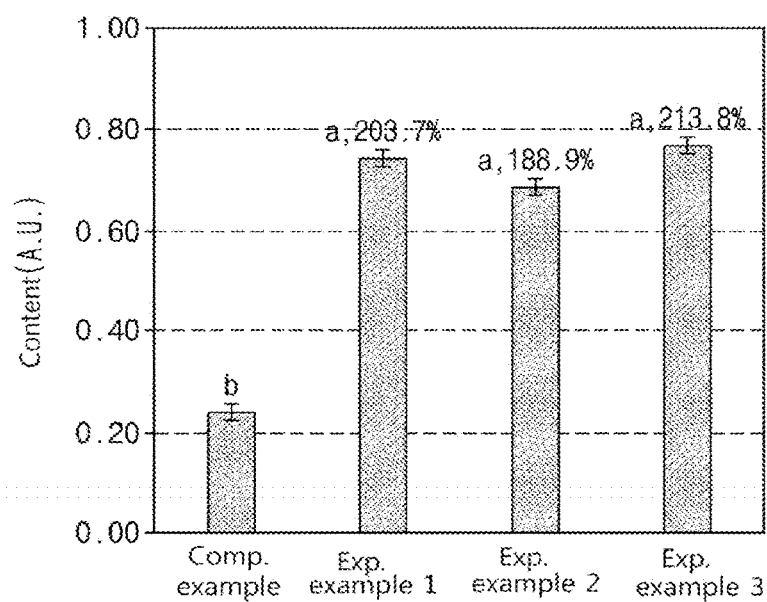
Figure 9C:
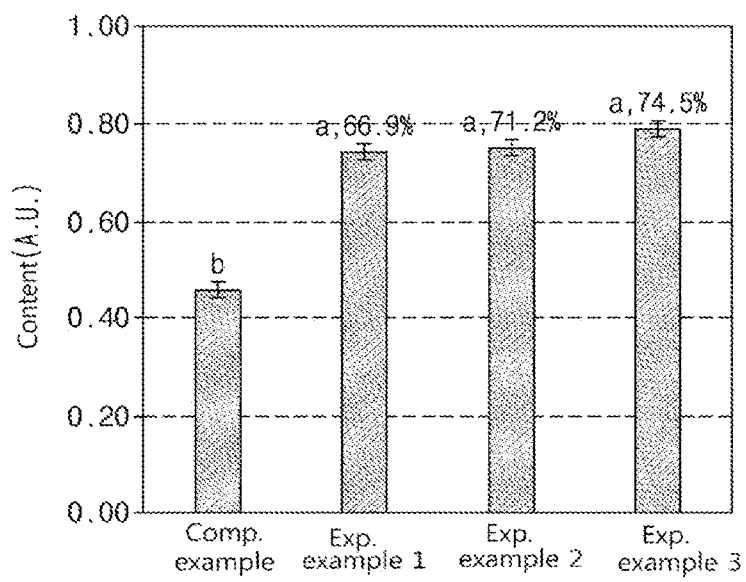
Figure 9D:
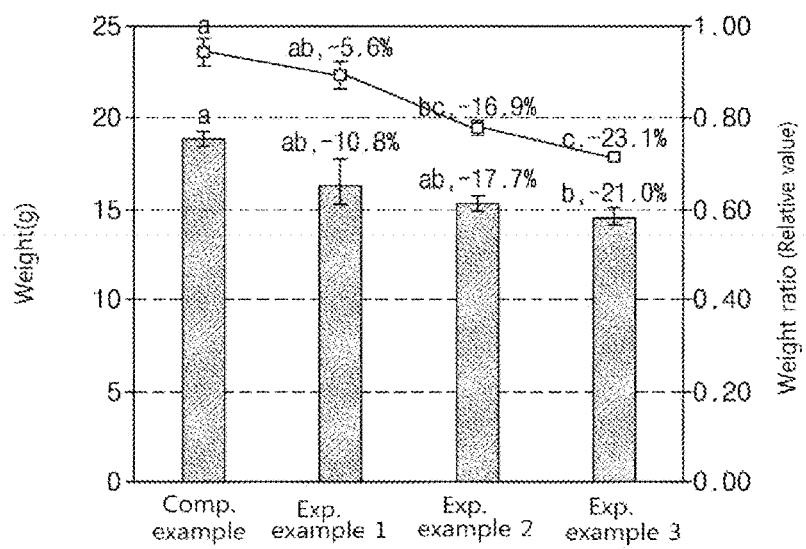

FIGS. 9A to 9D are graphs showing the content of the active ingredients contained in the red leaf lettuce (Jeokchima) after harvest in Comparative example and Experimental examples 1 to 3. FIGS. 9A to 9D show the content of the active ingredients, and the active ingredients in FIGS. 9A to 9C sequentially correspond to chlorophylls, flavonoids, and anthocyanins. FIG. 9D shows a bio weight at harvest and a dry weight of the red leaf lettuce (Jeokchima).

To obtain results according to Comparative example and Experimental examples 1 to 3, the plants were harvested on the 31st day after sowing, and contents of chlorophylls, flavonols, and anthocyanins were measured by providing a light to the leaf using an optical sensor called Dualex, that is a non-destructive analyzer. A total of 18 red leaf lettuces (Jeokchima) were measured (n=18). Then, nine plants were harvested to measure the bio weight (n=9), and five plants among the nine plants were lyophilized for about 3 days after suspension of bioactivity with liquid nitrogen to measure the dry weight (n=5).

FIG. 9A is a graph of the chlorophyll content, and all experimental examples 1, 2, and 3 showed higher values than Comparative example. Experimental examples 1 and 3 showed similar values, Experimental example 2 was higher than Comparative example and lower than Experimental example 3, but there was no significant difference from Experimental example 1. The chlorophyll content in Experimental examples 1, 2 and 3 was increased by about 28.1%, about 18.4%, and about 38.6%, respectively, compared to Comparative examples.

FIG. 9B is a graph of the flavonol content, and all Experimental examples 1, 2, and 3 showed higher values than Comparative example. There was no substantial difference between experimental examples 1 to 3. The flavonol content in Experimental examples 1, 2 and 3 increased by about 203.7%, about 188.9%, and about 213.8%, respectively, compared to the comparative examples.

FIG. 9C is a graph of the anthocyanin content, and all Experimental examples 1, 2, and 3 showed higher values than the comparative example. There was no substantial difference between Experimental examples 1 to 3. The anthocyanin content in experimental examples 1, 2 and 3 increased by about 66.9%, about 71.2%, and about 74.5%, respectively, compared to the comparative examples.

FIG. 9D is a graph of the bio weight and the dry weight, and there was no substantial difference in the bio weight and the dry weight between Comparative example and Experimental example 1. There was no difference in the bio weight between Comparative example and Experimental example 2, however, the dry weight was reduced by about 16.9%. Experimental example 3 showed lower bio weight and dry weight than Comparative example, the bio weight was reduced by about 21.0%, and dry weight was reduced by about 23.1%.

Consequently, it was found that the total cumulative energy amount should not exceed about 2.304 kJ/m², as in Experimental example 1, to meet the conditions under which functional materials may increase without affecting the bio weight and the dry weight.

Although the exemplary embodiments of the present disclosure have been described, it is understood that the present disclosure should not be limited to these exemplary embodiments but various changes and modifications can be made by one ordinary skilled in the art within the spirit and scope of the present disclosure as hereinafter claimed.

Therefore, the disclosed subject matter should not be limited to any single embodiment described herein, and the scope of the present inventive concept shall be determined according to the attached claims.

We claim:

1. A light source comprising:
at least one light emitter, the at least one light emitter comprising:
a first semiconductor layer,
a second semiconductor layer, and
an active layer, the active layer being disposed on the first semiconductor layer to emit a light having a specific wavelength due to a band gap difference in an energy band depending on a material used to form the active layer,
wherein a light period includes a first period comprising a region of the light period and a second period comprising a remaining region of the light period, the light source configured to be turned on, or turned off depending on the light period and a dark period, and
wherein the light source includes a first light source configured to emit a first light in the first period and a second light source configured to emit a second light having a different wavelength from the first light in the second period, and
wherein the first light includes a red light and a blue light and an amount of the blue light is different from an amount of the red light.

2. The light source of claim 1, wherein the second light is provided in an on and off manner.

3. The light source of claim 1, wherein the light source comprises:
a first light emitter configured to emit the first light; and
a second light emitter configured to emit the second light, and
one of the first light emitter or the second light emitters is turned on in the first period, the second period, or both.

4. The light source of claim 3, wherein the first light comprises a light of a visible light wavelength band, and the second light comprises a light of an ultraviolet light wavelength band.

5. The light source of claim 4, wherein the second light has a peak wavelength in an ultraviolet B wavelength band.

6. The light source of claim 5, wherein the light source is configured to emit light over a predetermined number of light periods, and wherein a total cumulative energy amount of the second light irradiated during the predetermined number of light periods is equal to, or smaller than about 2.304 KJ/m².

7. The light source of claim 5, wherein the second light has a peak wavelength in a wavelength band from about 280 nm to about 315 nm.

8. The light source of claim 1, wherein the first period and the second period, which are next to each other, form a repetition period.

9. The light source of claim 8, wherein the second light provided in the second period of the repetition period is not provided in the first period.

10. The light source of claim 1, wherein the second period corresponds to a light period for a predetermined number of days.

11. The light source of claim 1, wherein the light period is configured to increase a content of an active ingredient in a plant.

12. A light device, comprising:
a main body;
a light source provided in the main body to irradiate a light; and
a controller connected to the light source by wire or wirelessly, wherein the light source is configured to be turned on, or turned off depending on a light period and a dark period, wherein the light source includes a first light source having a first light and a second light source having a second light, wherein the light period includes a first period comprising a region of the light period and a second period comprising a remaining region of the light period, at least one of the first period and the second period being customized, wherein the controller is configured to control the light source to emit the first light in the first period and emit the first light and the second light of a different wavelength from the first light in the second period, wherein the light comprises visible light, and wherein the first light includes a red light and a blue light and an amount of the blue light is different from an amount of the red light.

13. The light device of claim 12, wherein the light source comprises:
a first light emitter configured to emit the first light; and
a second light emitter configured to emit the second light, and
the controller is configured to turn on one of the first light emitter or the second light emitter in at least one period of the first and second periods.

14. The light device of claim 12, wherein the controller is configured to control the light source to emit the second light in an on and off manner.

15. The light device of claim 12, wherein the first light comprises a light of a visible light wavelength band, and the second light comprises a light of an ultraviolet light wavelength band.

16. The light device of claim 15, wherein the second light has a peak wavelength in an ultraviolet B wavelength band.

17. The light device of claim 16, wherein the controller is configured to control the light source to emit light over a predetermined number of light periods, and wherein a total cumulative energy amount of the second light irradiated to the plant during the predetermined number of light periods is equal to, or smaller than about 2.304 KJ/m$^2$.

18. A light source comprising:
at least one light emitter, the at least one light emitter comprising:
a first semiconductor layer,
a second semiconductor layer, and
an active layer, the active layer being disposed on the first semiconductor layer to emit a light having a specific wavelength due to a band gap difference in an energy band depending on a material used to form the active layer, wherein a light period includes a first period comprising a region of the light period and a second period comprising a remaining region of the light period, the first period and the second period being customized, wherein the light source includes a first light source configured to emit a first light in the first period and a second light configured to emit a second light of a different wavelength from the first light in the second period, wherein the first light includes a red light and a blue light and an amount of the blue light is different from an amount of the red light, and wherein the first light has a longer peak wavelength than a peak wavelength of the second light.

19. The light source of claim 18, wherein the first period and the second period, which are next to each other, form one repetition period.

20. The light source of claim 19, wherein the second light provided in the second period of the repetition period is not provided in the first period.

* * * * *